United States Patent
Rho

(10) Patent No.: US 11,502,136 B2
(45) Date of Patent: Nov. 15, 2022

(54) DISPLAY PANEL

(71) Applicant: Samsung Display Co., LTD., Yongin-si (KR)

(72) Inventor: Sooguy Rho, Asan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 211 days.

(21) Appl. No.: 17/071,934

(22) Filed: Oct. 15, 2020

(65) Prior Publication Data
US 2021/0143223 A1    May 13, 2021

(30) Foreign Application Priority Data

Nov. 11, 2019    (KR) .................. 10-2019-0143523
Jun. 2, 2020    (KR) .................. 10-2020-0066737

(51) Int. Cl.
    *H01L 27/32*      (2006.01)

(52) U.S. Cl.
    CPC ................... *H01L 27/322* (2013.01)

(58) Field of Classification Search
    CPC .............. H01L 27/322; H01L 27/3246; H01L 27/3218; H01L 27/3216; H01L 51/5044; H01L 51/524; H01L 51/5253; H01L 51/5284; H01L 27/3211; H01L 51/5262; H01L 33/503
See application file for complete search history.

(56) References Cited

U.S. PATENT DOCUMENTS

| | | | |
|---|---|---|---|
| 10,714,540 B2* | 7/2020 | Kim | H01L 51/5268 |
| 2015/0331278 A1 | 11/2015 | Araki et al. | |
| 2016/0033816 A1* | 2/2016 | Yoon | G02F 1/13439 349/108 |
| 2018/0374409 A1 | 12/2018 | Lee et al. | |
| 2019/0107758 A1* | 4/2019 | Park | G02F 1/133514 |

FOREIGN PATENT DOCUMENTS

| | | |
|---|---|---|
| JP | 2015-219272 | 12/2015 |
| KR | 10-2014-0094866 | 7/2014 |
| KR | 10-2018-0074644 | 7/2018 |
| KR | 10-2019-0000759 | 1/2019 |
| KR | 10-1971045 | 4/2019 |
| KR | 10-2021-0057647 | 5/2021 |

* cited by examiner

*Primary Examiner* — Anne M Hines
*Assistant Examiner* — Jose M Diaz
(74) *Attorney, Agent, or Firm* — H.C. Park & Associates, PLC

(57) ABSTRACT

A display panel includes: a first substrate including a plurality of light emitting elements to emit a first light; and a second substrate disposed on the first substrate, the second substrate including: a first color filter including a first blue filter, a second blue filter, and a third blue filter disposed on the first substrate; a light control layer including a first light control portion to transmit the first light and disposed on the first blue filter, a second light control portion to convert the first light to a second light and disposed on the second blue filter, and a third light control portion to convert the first light to a third light and disposed on the third blue filter; and a second color filter exposing an upper surface of the first light control portion and covering the second light control portion and the third light control portion.

20 Claims, 24 Drawing Sheets

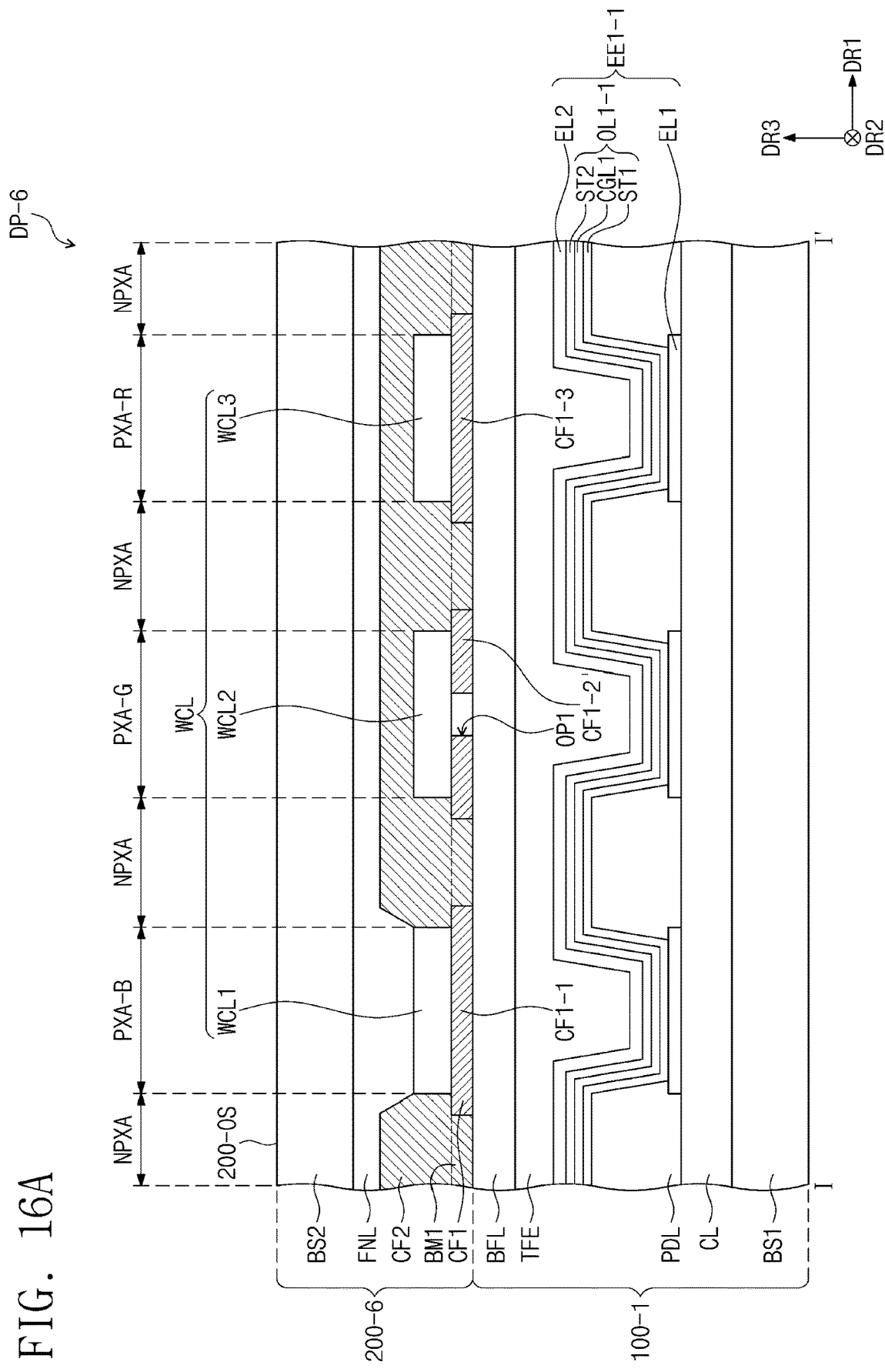

DISPLAY PANEL

CROSS-REFERENCE TO RELATED APPLICATIONS

This application claims priority from and the benefit of Korean Patent Application Nos. 10-2019-0143523, filed on Nov. 11, 2019, and 10-2020-0066737, filed on Jun. 2, 2020, which are hereby incorporated by reference for all purposes as if fully set forth herein.

BACKGROUND

Field

Exemplary implementations of the invention relate generally to a display panel and more specifically, to a display panel having improved light efficiency and high color reproducibility.

Discussion of the Background

Various display devices that are applied to multimedia devices, such as televisions, mobile phones, tablet computers, navigation devices, and game devices, are being developed. The display device includes a display panel with self-emissive type light emitting elements which emit a light using a light emitting material to display images.

In addition, the display device includes different types of light control layers according to on pixels to improve a color reproducibility of the display device. The light control layers transmit only a portion of wavelength of the light or convert the wavelength of the light. A light emitting element employing a quantum dot as its light emitting materials is being developed, and there is a demand to improve a light emission efficiency and a color reproducibility of the light emitting element using the quantum dot.

The above information disclosed in this Background section is only for understanding of the background of the inventive concepts, and, therefore, it may contain information that does not constitute prior art.

SUMMARY

Applicant discovered that when light control layers of a display device are used to convert a wavelength of light, a color reproducibility and light efficiency of the display device are degraded.

Display devices with a display panel having light control layers and color filters constructed according to the principles and exemplary implementations of the invention provide improved color reproducibility of the display panel. For example the color filters of the display panel increases the color purity of light emitted from the light control layers.

In addition, display devices with a display panel having light emitting layers constructed according to the principles and exemplary implementations of the invention provide improved light efficiency of the display panel. For example, the light emitting layers of the display panel has the increased light efficiency.

Additional features of the inventive concepts will be set forth in the description which follows, and in part will be apparent from the description, or may be learned by practice of the inventive concepts.

According to an exemplary embodiment, a display panel includes: a first substrate including a plurality of light emitting elements to emit a first light; and a second substrate disposed on the first substrate, the second substrate including: a first color filter including a first blue filter, a second blue filter, and a third blue filter disposed on the first substrate; a light control layer including a first light control portion to transmit the first light and disposed on the first blue filter, a second light control portion to convert the first light to a second light and disposed on the second blue filter, and a third light control portion to convert the first light to a third light and disposed on the third blue filter; and a second color filter exposing an upper surface of the first light control portion and covering the second light control portion and the third light control portion.

The first, second, and third blue filters may be disposed to be spaced apart from each other, and the second substrate may further includes a first division pattern disposed between the first, second, and third blue filters.

The first division pattern may include a same material as the second color filter.

The first division pattern may include a black-coloring agent.

The display panel may further include a second division pattern and a third division pattern, which are disposed above the light control layer and may not overlap the first, second, and third light control portions, wherein: the second division pattern may include a black-coloring agent, and the third division pattern may be disposed on the second division pattern and includes a blue-coloring agent.

Each of the plurality of light emitting elements may include a first electrode, a second electrode, and an organic layer disposed between the first and second electrodes, the organic layer including a first light emitting layer to generate the first light.

The first electrode of each of the plurality of light emitting elements may overlap each of the first, second, and third blue filters, and an area of each of the first, second, and third blue filters in a plan view may be greater than an area of the first electrode in a plan view.

The organic layer may further include a second light emitting layer to emit the second light, the second blue filter may be provided with a first opening defined therethrough, and the first opening may overlap the second light control portion.

The organic layer may further include a third light emitting layer to emit the third light, the third blue filter may be provided with a second opening defined therethrough, and the second opening may overlap the third light control portion.

Each of the first, second, and third blue filters may be configured to transmit the first light, and the second color filter may include a material to absorb the first light.

The first light may be a blue light, the second light may be a green light, and the third light may be a red light.

The second color filter may be configured to transmit the second light and the third light.

The second blue filter may extend from the first blue filter, and the third blue filter may extend from the second blue filter.

The display panel may further include a barrier wall that may not overlap the first, second, and third light control portions and may be disposed between the first color filter and the second color filter, wherein: the barrier wall may include a first barrier wall, a second barrier wall, and a third barrier wall, which are sequentially stacked, the first barrier wall may include a same material as the second color filter, the second barrier wall may include an inorganic material, and the third barrier wall may include an organic material.

According to another exemplary embodiment, a display panel includes: a first color filter disposed to overlap first, second, and third light emitting areas; a first light control portion overlapping the first light emitting area and disposed on the first color filter; a second light control portion overlapping the second light emitting area and disposed on the first color filter; a third light control portion overlapping the third light emitting area and disposed on the first color filter; and a second color filter disposed on the first color filter and covering the second light control portion and the third light control portion, wherein: a first light emitting element is disposed in the first light emitting area, a second light emitting element is disposed in the second light emitting area, a third light emitting element is disposed in the third light emitting area, the first, second, and third light emitting elements are configured to emit a first light, and a non-light-emitting area is defined adjacent to the first, second, and third light emitting areas.

According to another exemplary embodiment, a display panel includes: a first substrate including a plurality of light emitting elements to emit a first light; and a second substrate disposed on the first substrate and including a light emitting area in which the light emitting elements are disposed and a non-light-emitting area defined adjacent to the light emitting area, the second substrate including: a first color filter disposed on the first substrate and to transmit the first light; first, second, and third light control portions disposed on the first color filter and overlapping the light emitting area; a barrier wall overlapping the non-light-emitting area and disposed on the first color filter; and a second color filter covering the barrier wall, the second light control portion, and the third light control portion and exposing an upper surface of the first light control portion, wherein: the first light control portion is configured to transmit the first light, the second light control portion is configured to convert the first light to a second light, the third light control portion is configured to convert the first light to a third light, and the second color filter is configured to absorb the first light.

The barrier wall may include a first barrier wall, a second barrier wall, and a third barrier wall, which are sequentially stacked, and wherein: the first barrier wall may include a same material as the second color filter, the second barrier wall may include an inorganic material, and the third barrier wall may include an organic material.

At least a portion of the second barrier wall may be inserted into each of the first, second, and third light control portions.

Each of the light emitting elements may include a first electrode, a second electrode, and an organic layer disposed between the first and second electrodes, the organic layer including a first light emitting layer to generate the first light.

The organic layer may further include a second light emitting layer to emit the second light or a third light emitting layer to emit the third light, and the first color filter may be provided with an opening defined therethrough.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 16A is a cross-sectional view taken along a line I-I' of FIG. 3 illustrating another exemplary embodiment of the display panel of FIG. 1A.

DETAILED DESCRIPTION

Figure 1A:
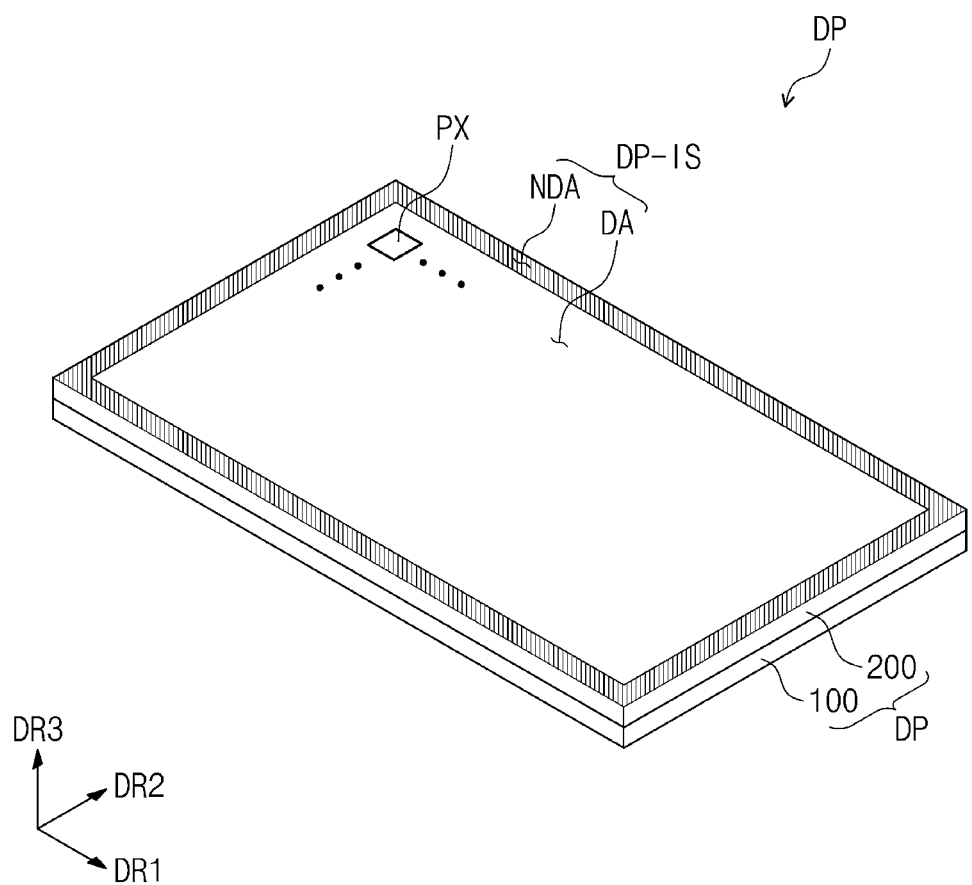
FIG. 1A is a perspective view of an exemplary embodiment of a display panel constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at east one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise, Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," to and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to accompanying drawings.

Figure 1B:
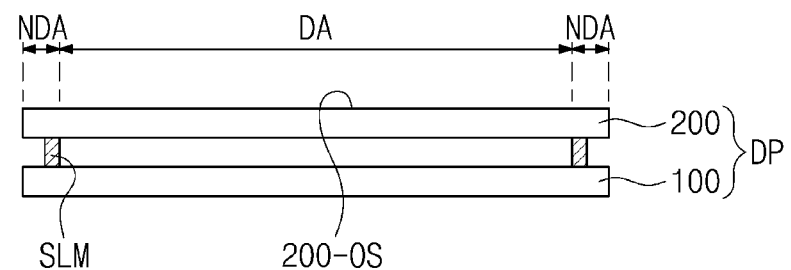
FIG. 1B is a cross-sectional view of the display panel of FIG. 1A.
Figure 1B:
Figure 2:
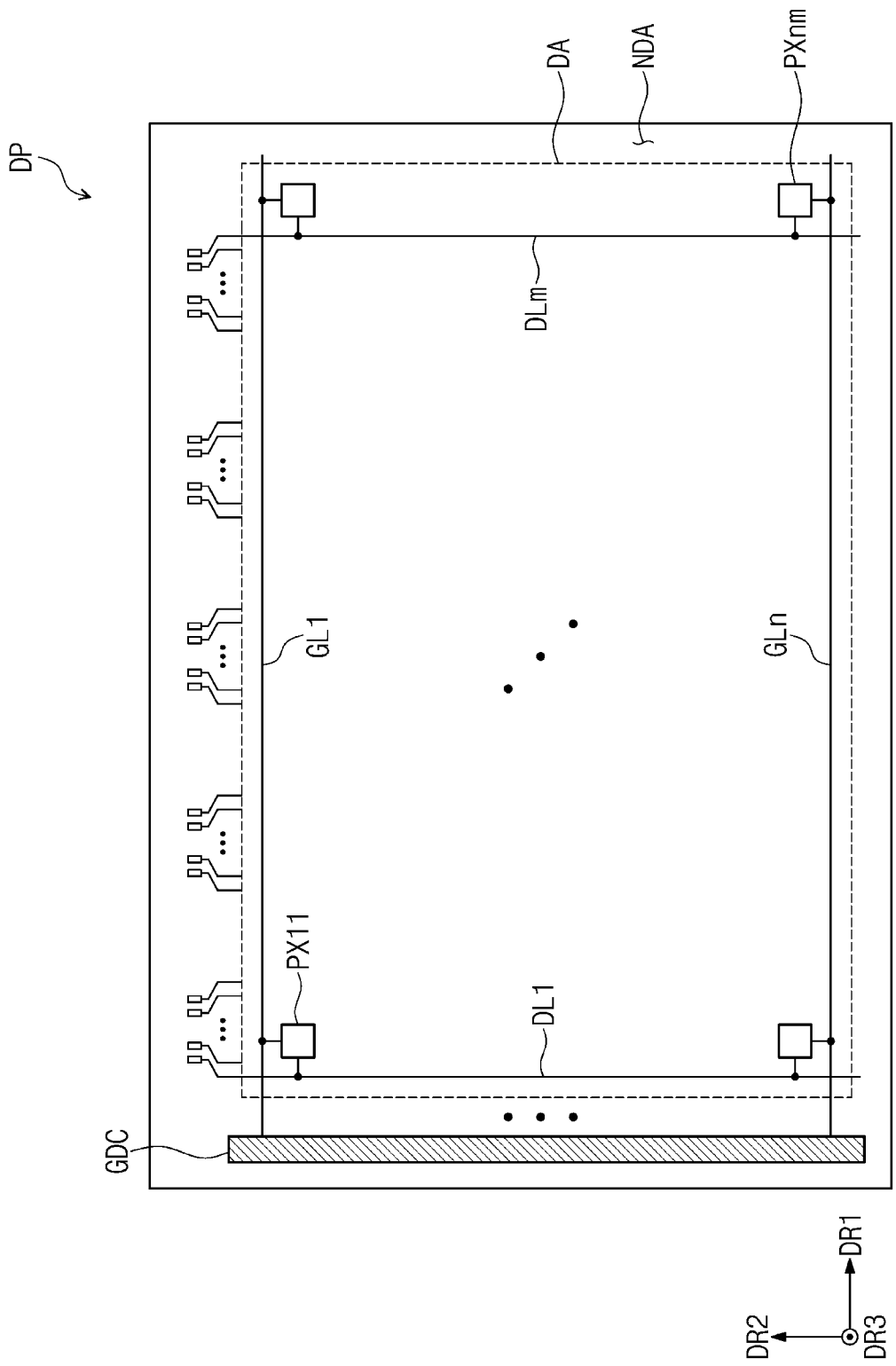
FIG. 2 is a plan view of the display panel of FIG. 1A.
Figure 3:
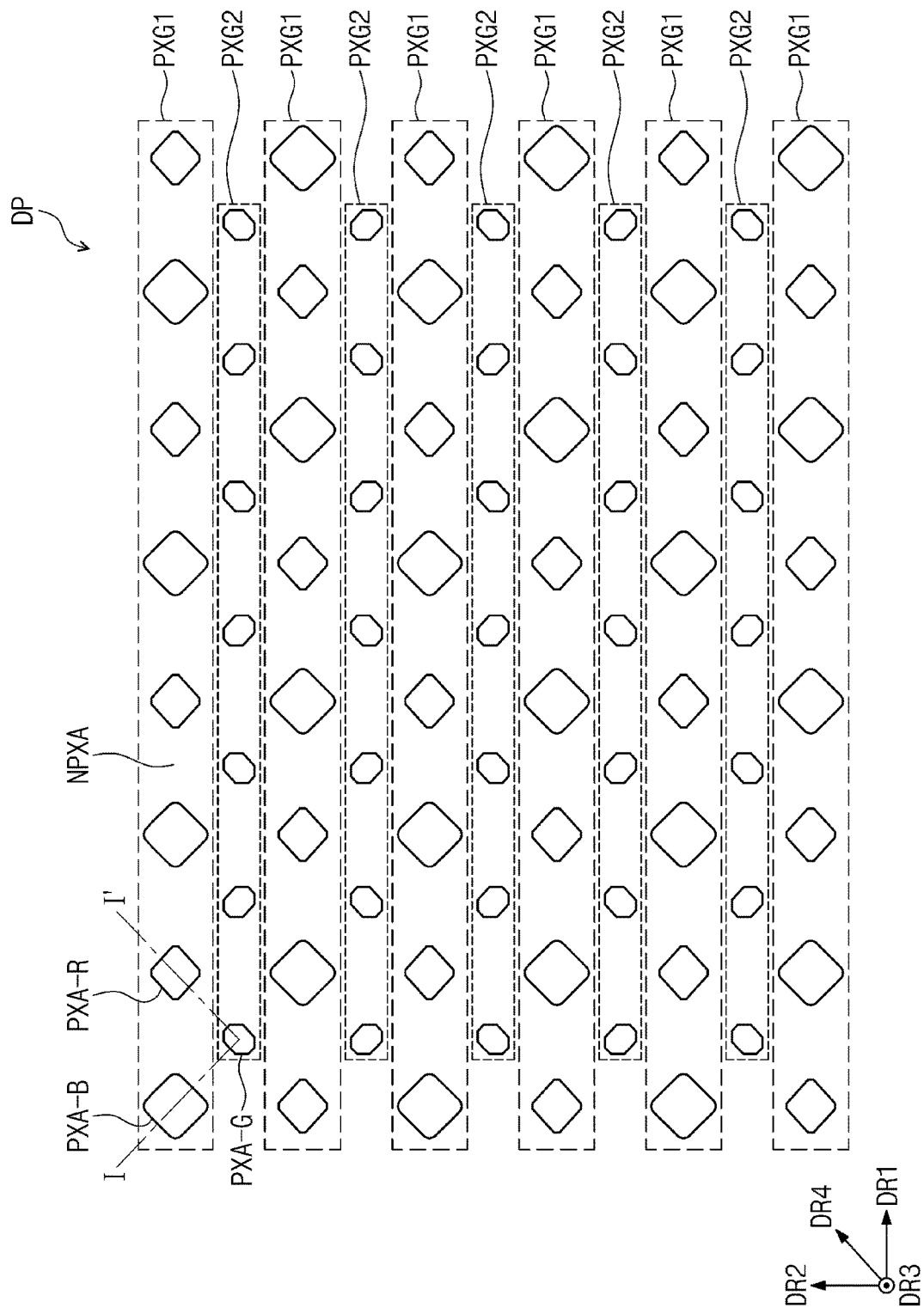
FIG. 3 is a plan view of a portion of the display panel of FIG. 1A.

FIG. 1A is a perspective view of an exemplary embodiment of a display panel constructed according to the principles of the invention. FIG. 1B is a cross-sectional view of the display panel of FIG. 1A. FIG. 2 is a plan view of the display panel of FIG. 1A. FIG. 3 is a plan view of a portion of the display panel of FIG. 1A. FIGS. 4 to 9 are cross-sectional views taken along a line I-I' of FIG. 3 illustrating various exemplary embodiments of the display panel of FIG. 1A.

Referring to FIGS. 1A, 1B, and 2, the display panel DP may be one of a liquid crystal display panel, an electrophoretic display panel, a microelectromechanical system (MEMS) display panel, an electro-wetting display panel, and an organic light emitting display panel. However, exemplary embodiments are not limited thereto.

The display panel DP may further include a chassis or a molding and may further include a backlight unit according to the type of the display panel DP.

The display panel DP may include a first substrate 100 (or lower display substrate) and a second substrate 200 (or upper display substrate) facing the first substrate 100 and spaced apart from the first substrate 100. A predetermined cell gap may be formed between the first substrate 100 and the second substrate 200. The cell gap may be maintained by a sealant SLM that combines the first substrate 100 and the second substrate 200. A grayscale display layer may be disposed between the first substrate 100 and the second substrate 200 to generate an image. The grayscale display layer may include a liquid crystal layer, an organic light emitting layer, and an electrophoretic layer according to the type of the display panel.

As shown in FIG. 1A, the display panel DP may display the image through a display surface DP-IS. An outer surface 200-OS of the second substrate 200 shown in FIG. 1B may be defined as the display surface DP-IS.

The display surface DP-IS may be substantially parallel to a plane defined by a first direction DR1 and a second direction DR2. The display surface DP-IS may include a display area DA and a non-display area NDA. Pixels PX may be arranged in the display area DA and may not be arranged in the non-display area NDA. The non-display area NDA may be defined along an edge of the display surface DP-IS. The display area DA may be surrounded by the non-display area NDA. According to an exemplary embodiment, the non-display area NDA may be omitted or may be disposed at only one side of the display area DA.

A third direction DR3 may indicate a normal line direction of the display surface DP-IS, i.e., a thickness direction of the display panel DP. Front (or upper) and rear (or lower) surfaces of each layer or each unit described hereinafter are distinguished from each other by the third direction DR3. However, the first, second, and third directions DR1, DR2, and DR3 are merely exemplary.

In the exemplary embodiment, the display panel DP includes a flat-shaped display surface DP-IS. However, exemplary embodiments are not limited thereto. For example, the display panel DP may include a curved display surface or a three-dimensional display surface. The three-dimensional display surface may include a plurality of display areas facing different directions from each other.

FIG. 2 shows an arrangement relationship between signal lines GL1 to GLn and DL1 to DLm and the pixels PX11 to PXnm in a plan view. The signal lines GL1 to GLn and DL1 to DLm may include a plurality of gate lines GL1 to GLn and a plurality of data lines DL1 to DLm.

Each of the pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element. Various types of signal lines may be provided in the display panel DP according to configurations of the pixel driving circuit of the pixels PX11 to PXnm.

The pixels PX11 to PXnm may be arranged in a matrix form, however, they are not limited thereto or thereby. The pixels PX11 to PXnm may be arranged in a pentile pixel array. The pixels PX11 to PXnm may be arranged in a diamond pixel array. A gate driving circuit GDC may be integrated in the display panel DP through an oxide silicon gate driver circuit (OSG) process or an amorphous silicon gate driver circuit (ASG) process.

Referring to FIG. 3, the display panel DP may include a non-light-emitting area NPXA and light emitting areas PXA-R, PXA-G, and PXA-B. Each of the light emitting areas PXA-R, PXA-G, and PXA-B may be an area from which a light generated by a corresponding light emitting element among a plurality of light emitting elements EE (refer to FIG. 4) exits. The light emitting areas PXA-R, PXA-G, and PXA-B may have different sizes from each other, and in this case, the size may mean a size when viewed in a plane. In the present descriptions, the expression "when viewed in the plane" may mean that the display panel DP is viewed in the third direction DR3 (the thickness direction). The light emitting areas PXA-R, PXA-G, and PXA-B may be classified into a plurality of groups in accordance with colors of the lights generated by the light emitting elements EE. For example, each of the light emitting areas PXA-R, PXA-G, and PXA-B may correspond to the pixel.

The display panel DP shown in FIG. 3 may include three light emitting areas PXA-R, PXA-G, and PXA-B respectively emitting a first light, a second light, and a third light as a representative example. For example, the display panel DP may include a first light emitting area PXA-B, a second light emitting area PXA-G, and a third light emitting area PXA-R, which are distinguished from each other.

A light emitting element disposed in the first light emitting area PXA-B among the light emitting elements EE may be defined as a first light emitting element. A light emitting element disposed in the second light emitting area PXA-G among the light emitting elements EE may be defined as a second light emitting element. A light emitting element disposed in the third light emitting area PXA-R among the light emitting elements EE may be defined as a third light emitting element.

According to an exemplary embodiment, the display panel DP may include the light emitting elements EE (refer to FIG. 4) emitting the first light. For example, the first, second, and third light emitting elements may emit the first light.

In addition, the display panel DP according to an exemplary embodiment may include light control portions WCL1, WCL2, and WCL3 (refer to FIG. 4) transmitting or absorbing the first light to emit lights having different wavelength regions from each other. The light control portions WCL1, WCL2, and WCL3 (refer to FIG. 4) may absorb or transmit the first light to emit the lights having different colors from each other. For example, a first light control portion WCL1 may transmit the first light, a second light control portion WCL2 may absorb the first light and may emit the second light, and a third light control portion WCL3 may absorb the first light and may emit the third light. However, exemplary embodiments are not limited thereto or thereby. For example, the first light may be a blue light, the second light may be a green light, and the third light may be a red light. For example, the first light may be the blue light having a center wavelength equal to or greater than about 420 nm and equal to or smaller than about 480 nm, the second light may be the green light having a center wavelength equal to or greater than about 500 nm and equal to or smaller than about 580 nm, and the third light may be the red light having a center wavelength equal to or greater than about 600 nm and equal to or smaller than about 670 nm.

The light control portions WCL1, WCL2, and WCL3 may be disposed to respectively correspond to the first light emitting area PXA-B, the second light emitting area PXA-G, and the third light emitting area PXA-R and may respectively overlap the first light emitting area PXA-B, the second light emitting area PXA-G, and the third light emitting area PXA-R in a plan view. For example, the first light emitting area PXA-B may be a blue light emitting area, the second light emitting area PXA-G may be a green light emitting area, and the third light emitting area PXA-R may be a red light emitting area.

In the display panel DP according to the exemplary embodiment, the first light emitting areas PXA-B may be alternately arranged with the third light emitting areas PXA-R in the first direction DR1 and may form a first group PXG1. The second light emitting areas PXA-G may be arranged in the second direction DR2 and may form a second group PXG2.

The first group PXG1 may be disposed to be spaced apart from the second group PXG2 in the second direction DR2. Each of the first group PXG1 and the second group PXG2 may be provided in a plural number. The first groups PXG1 may be alternately arranged with the second groups PXG2 in the second direction DR2.

One second light emitting area PXA-G may be disposed to be spaced apart from one first light emitting area PXA-B or one third light emitting area PXA-R in a fourth direction DR4. The fourth direction DR4 may be a direction between the first direction DR1 and the second direction DR2.

The arrangement structure of the light emitting areas PXA-R, PXA-G, and PXA-B shown in FIG. 3 may be called the pentile structure. However, the arrangement structure of the light emitting areas PXA-R, PXA-G, and PXA-B of the display panel DP is not limited to the arrangement structure shown in FIG. 3. For example, the light emitting areas PXA-R, PXA-G, and PXA-B may be arranged in a stripe structure in which the first light emitting area PXA-B, the second light emitting area PXA-G, and the third light emitting area PXA-R are sequentially and alternately arranged in the second direction DR2.

In addition, the light emitting areas PXA-R, PXA-G, and PXA-B may have different sizes depending on the colors of the lights emitted from the light control portions WCL1, WCL2, and WCL3. For example, the first light emitting area PXA-B corresponding to the first light control portion WCL1 emitting the first light may have the greatest size, and the second light emitting area PXA-G corresponding to the second light control portion WCL2 emitting the second light may have the smallest size. However, exemplary embodiments are not limited thereto or thereby. For example, the light emitting areas PXA-R, PXA-G, and PXA-B may have the same size as each other, or the light emitting areas PXA-R, PXA-G, and PXA-B may be provided with different area ratios from the embodiment. Hereinafter, for the convenience of explanation, the light emitting areas PXA-R, PXA-G, and PXA-B will be described as having the same size in FIGS. 4 to 9. However, when the pentile structure shown in FIG. 3 is applied in the light emitting areas PXA-R, PXA-G, and PXA-B of FIGS. 4 to 9, the first light emitting area PXA-B corresponding to the first light control portion WCL1 emitting the first light may have the greatest size, and the second light emitting area PXA-G corresponding to the second light control portion WCL2 emitting the second light may have the smallest size. However, exemplary embodiments are not limited thereto.

Figure 4:
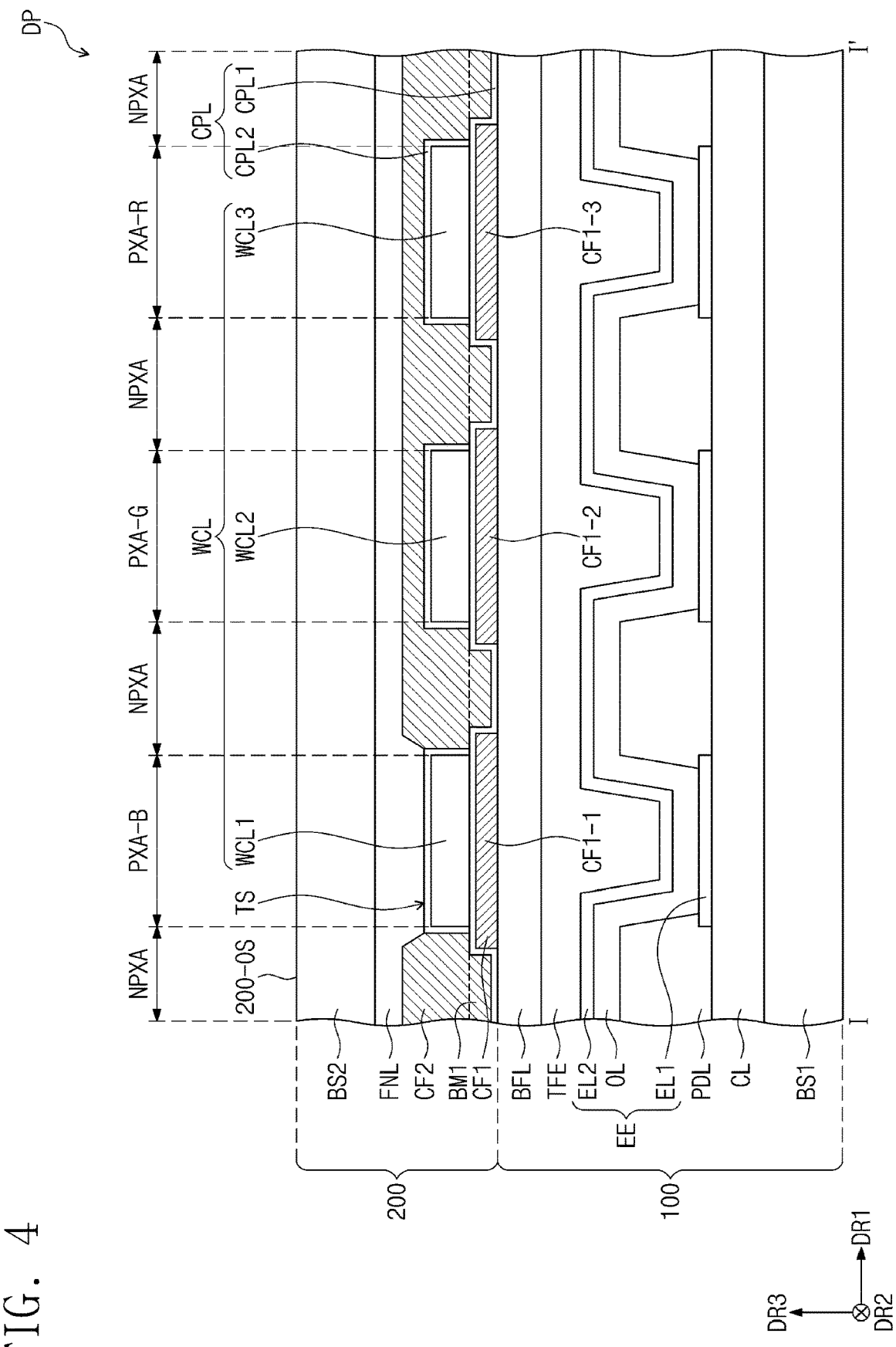
FIGS. 4, 5, 6, 7, 8, and 9 are cross-sectional views taken along a line I-I' of FIG. 3 illustrating various exemplary embodiments of the display panel of FIG. 1A.

Referring to FIG. 4, the display panel DP may include a first substrate 100 and a second substrate 200.

The first substrate 100 may include a first base substrate BSI, a circuit layer CL, the light emitting elements EE, a thin film encapsulation layer TFE, and a buffer layer BFL. The first base substrate BS1, the circuit layer CL, the light emitting elements EE, the thin film encapsulation layer TFE, and the buffer layer BFL may be sequentially stacked in the third direction DR3. However, the configurations of the first substrate 100 are not limited thereto or thereby.

The first base substrate BS1 may provide a base surface on which the light emitting elements EE are disposed. The first base substrate BS1 may include a synthetic resin substrate or a glass substrate. The first base substrate BSI may be rigid or flexible. In the exemplary embodiment, the first base substrate BS1 may be rigid. However, exemplary embodiments are not limited thereto or thereby.

The circuit layer CL may be disposed on the first base substrate BS1. The circuit layer CL may include a plurality of transistors. Each of the transistors may include a control electrode, an input electrode, and an output electrode. For example, the circuit layer CL may include a switching transistor and a driving transistor to drive the light emitting elements EE.

A pixel definition layer PDL may be disposed on the circuit layer CL. The pixel definition layer PDL may define the light emitting areas PXA-R, PXA-G, and PXA-B. The light emitting areas PXA-R, PXA-G, and PXA-B may be distinguished from the non-light-emitting area NPXA by the pixel definition layer PDL. The non-light emitting areas NPXA may be areas defined between the light emitting areas PXA-R, PXA-G, and PXA-B adjacent to each other and may correspond to the pixel definition layer PDL. The pixel definition layer PDL may be formed of a polymer resin. For example, the pixel definition layer PDL may be formed of a polyacrylate-based resin or a polyimide-based resin.

In addition, the pixel definition layer PDL may include an inorganic material. For example, the pixel definition layer PDL may include silicon nitride (SiNx), silicon oxide (SiOx), silicon oxynitride (SiOxNy), or the like.

Each of the light emitting elements EE may include a first electrode EL1, a second electrode EL2, and at least one organic layer OL. The first electrode EL1 may be disposed on the circuit layer CL. The first electrode EL1 may be electrically connected to the driving transistor to receive a driving signal. The first electrodes EL1 may be disposed on a plurality of openings defined in a pixel definition layers PDL to be spaced apart from each other. The second electrode EL2 may be disposed on the first electrode ELL The organic layer OL may be disposed between the first electrode EL1 and the second electrode EL2.

The first electrode EL1 and the second electrode EL2 of the light emitting element EE may have a conductivity. The first electrode EL1 and the second electrode EL2 may include a metal alloy or a conductive compound. The first electrode EL1 may be an anode. The first electrode EL1 may be a pixel electrode. The second electrode may be a cathode. The second electrode EL2 may be a common electrode. Each of the first electrode EL1 and the second electrode EL2 of the light emitting element EE may be a reflective electrode, a transmissive electrode, or a transflective electrode. In the exemplary embodiment, the first electrode EL1 may be the reflective electrode, and the second electrode EL2 may be the transmissive electrode or the transflective electrode.

The organic layer OL may include a hole transport region, a light emitting layer, and an electron transport region. However, exemplary embodiments are not limited thereto or thereby. The hole transport region may include a hole injection layer and a hole transport layer. The electron transport region may include an electron injection layer and an electron transport layer. For example, the organic layer OL may further include a plurality of light emitting layers and a charge generation layer. This will be described in detail with reference to FIGS. 16A, 16B.

The light emitting layer may have a single-layer structure of a single material or plural different materials, or a multi-layer structure of layers formed of different materials. In the case where the display panel DP is an organic electroluminescence light emitting display panel, the organic layer OL may include anthracene derivatives, pyrene derivatives, fluoranthene derivatives, chrysene derivatives, dihydrobenzanthracene derivatives, or triphenylene derivatives. In detail, the light emitting layer may include anthracene derivatives and pyrene derivatives.

When the display panel DP is the organic electroluminescence light emitting display panel, the organic layer OL may include a host and a dopant. In detail, the light emitting layer of the organic layer OL may include the host and the dopant. For example, the light emitting layer may include at least one of DPEPO(Bis[2-(diphenylphosphino)phenyl] ether oxide), CBP(4,4'-Bis(carbazol-9-yl)biphenyl), mCP(1, 3-Bis(carbazol-9-yl)benzene), PPF (2,8-Bis(diphenylphosphoryl)dibenzo[b,d]furan), TcTa(4,4',4''-Tris(carbazol-9-yl)-triphenylamine), and TPBi(1,3,5-tris(N-phenylbenzimidazole-2-yl)benzene) as a host material. However, exemplary embodiments are not limited thereto or thereby. For example, Alq3(tris(8-hydroxyquinolino)aluminum), CBP(4,4'-bis(N-carbazolyl)-1,1'-biphenyl), PVK (poly(N-vinylcarbazole)), ADN(9,10-di(naphthalene-2-yl) anthracene), TCTA(4,4',4''-Tris(carbazol-9-yl)-triphenylamine), TPBi(1,3,5-tris(N-phenylbenzimidazole-2-yl)benzene), TBADN(3-tert-butyl-9,10-di(naphth-2-yl) anthracene), DSA(distyrylarylene), CDBP(4,4'-bis(9-carbazolyl)-2,2'-dimethyl-biphenyl), MADN(2-Methyl-9, 10-bis(naphthalen-2-yl)anthracene), CP1(Hexaphenyl cyclotriphosphazene), UGH2 (1,4-Bis(triphenylsilyl)benzene), DPSiO3 (Hexaphenylcyclotrisiloxane), DPSiO4 (Octaphenylcyclotetra siloxane), PPF(2,8-Bis(diphenylphosphoryl)dibenzofuran), and the like may be used as the host material.

In addition, the light emitting layer may include styryl derivatives (for example, 1,4-bis[2-(3-N-ethylcarbazoryl) vinyl]benzene(BCzVB), 4-(di-p-tolylamino)-4'-[(di-p-tolylamino)styryl]stilbene(DPAVB), and N-(4-((E)-2-(6-((E)-4-(diphenylamino)styryl)naphthalen-2-yl)vinyl)phenyl)-N-phenylbenzenamine(N-BDAVBi)), perylene and derivatives thereof (for example, 2,5,8,11-Tetra-t-butylperylene(TBP)), pyrene and derivatives thereof (for example, 1,1-dipyrene, 1,4-dipyrenylbenzene, 1,4-Bis(N,N-Diphenylamino) pyrene), and the like as a dopant material.

In a case where the light emitting layer includes the quantum dot, a core of the quantum dot may be selected from a group II-VI compound, a group III-V compound, a group IV-VI compound, a group IV element, a group IV compound, and a combination thereof.

The group II-VI compound may be selected from a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the ternary compound, or the quaternary compound may exist in particles at a uniform concentration or may exist in the same particle after being divided into plural portions having different concentrations. In addition, the quantum dot may have a core-shell structure where one quantum dot surrounds another quantum dot.

In some exemplary embodiments, the quantum dot may have the above-mentioned core-shell structure including the core containing nanocrystals and the shell surrounding the core. The shell of the quantum dot may serve as a protective layer to prevent chemical modification of the core and to maintain semiconductor properties and/or as a charging layer to impart electrophoretic properties to the quantum dot. The shell may have a single-layer or multi-layer structure. In the structure of the core and the shell, a concentration of elements existing in the shell may have a concentration gradient that gradually decreases to from the shell to the center. As the shell of the quantum dot, oxides of metals or nonmetals, semiconductor compounds, or combinations thereof may be used.

For example, the oxides of the metals or nonmetals may be binary elements, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, and $Co_3O_4$, NiO, or ternary elements, such as $MgAl_2O_4$, $CoFe_2O_4$, $NiFe_2O_4$, and $CoMn_2O_4$. However, exemplary embodiments are not limited thereto or thereby.

The semiconductor compounds may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. However, exemplary embodiments are not limited thereto or thereby.

The quantum dot may have a full width at half maximum (FWHM) of the light emitting wavelength spectrum, which is about 45 nm or less, preferably about 40 nm or less, and more preferably about 30 nm or less, and a color purity or a color reproducibility may be improved in the above-mentioned range. In addition, since the light emitted through the quantum dot travels in all directions, an optical viewing angle may be improved.

In addition, the quantum dot is not limited to a specific shape. In detail, the quantum dot may have a variety of shapes, e.g., a globular shape, a pyramid shape, a multi-arm shape, a cubic nano-particle, a nano-tube, a nano-wire, a nano-fabric, and a nanoplate-shaped particle.

The color of the light emitted from the quantum dot may be changed in accordance with the particle size. Therefore, the quantum dot may have a variety of light emitting colors, such as the blue, red, or green color.

In the exemplary embodiment, the light emitting layer may emit the first light. For example, when the display panel DP is the organic electroluminescent light emitting display panel, the light emitting layer may include an organic material emitting the blue light and may include a fluorescent material or a phosphorescent material. However, exemplary embodiments are not limited thereto or thereby.

For example, the organic layer OL may be provided to the light emitting elements EE adjacent to each other as a common layer. While the first electrode EL1 is patterned to form patterned electrodes that are provided on the circuit layer CL to be spaced apart from each other, each of the hole transport region, the light emitting layer, and the electron transport region may be disposed to extend in the entire of the light emitting elements EE without being patterned.

However, the exemplary embodiments are not limited thereto or thereby, and the hole transport region, the light emitting layer, and the electron transport region may be formed in each light emitting element EE after being patterned.

The thin film encapsulation layer TFE may be disposed on the second electrode EL2. The thin film encapsulation layer TFE may cover the light emitting elements EE. The thin film encapsulation layer TFE may be disposed directly on the second electrode EL2. When the light emitting element EE further includes a capping layer, the thin film encapsulation layer TFE may be disposed directly on the capping layer.

In the exemplary embodiment, the thin film encapsulation layer TFE may include two inorganic layers and an organic layer disposed between the two inorganic layers. As another ways, the thin film encapsulation layer TFE may include a plurality of inorganic layers and a plurality of organic layers that are alternately stacked with each other. In the thin film encapsulation layer TFE, the plurality of inorganic layers may protect the light emitting elements EE from moisture and oxygen, and the plurality of organic layers may protect the light emitting elements EE from foreign substance such as dust particles.

The first substrate 100 may further include the buffer layer BFL. The buffer layer BFL may be disposed on the thin film encapsulation layer TFE. The buffer layer BFL may protect the first substrate 100 from external impacts and foreign substances.

The second substrate 200 may be disposed on the first substrate 100. The second substrate 200 may include a first color filter CF1, a light control layer WCL, a second color filter CF2, a functional layer FNL, and a second base substrate BS2. The first color filter CF1, the light control layer WCL, the second color filter CF2, the functional layer FNL, and the second base substrate BS2 may be sequentially stacked in the third direction DR3. However, configurations of the second substrate 200 are not limited thereto or thereby.

The second base substrate BS2 may include a base surface on which each component is disposed during a manufacturing process of the second substrate 200. The functional layer FNL may protect the second substrate 200 from external impacts or foreign substances. For example, the functional layer FNL may serve the same function as the buffer layer BFL.

The second substrate 200 may further include a plurality of capping layers CPL1 and CPL2. The first capping layer CPL1 may be disposed on a plurality of first color filters CF1 and the first substrate 100. The second capping layer CPL2 may surround the light control layer WCL. In detail, the second capping layer CPL2 may surround each of the first light control portion WCL1, the second light control portion WCL2, and the third light control portion WCL3.

The capping layers CPL1 and CPL2 may prevent moisture and/or oxygen (hereinafter, referred to as "moisture/oxygen") from entering the display panel DP. The capping layers CPL1 and CPL2 may be disposed on the first color filters CF1 and may be disposed to cover the entire surface of the light control layer WCL, thereby preventing the light control layer WCL and the first color filters CF1 from being exposed to the moisture/oxygen.

The capping layers CPL1 and CPL2 may include at least one inorganic layer. For example, the capping layers CPL1 and CPL2 may include an inorganic material. For example, the capping layers CPL1 and CPL2 may include silicon nitride, aluminum nitride, zirconium nitride, titanium nitride, hafnium nitride, tantalum nitride, silicon oxide, aluminum oxide, titanium oxide, tin oxide, cerium oxide and silicon oxynitride or a thin metal layer having a light transmittance property. For example, the capping layers CPL1 and CPL2 may further include an organic layer. The capping layers CPL1 and CPL2 may have a single-layer or multi-layer structure.

In the exemplary embodiment, the first color filter CF1 may be disposed on the first substrate 100. In detail, the first color filter CF1 may include a first blue filter CF1-1, a second blue filter CF1-2, and a third blue filter CF1-3. In the exemplary embodiment, the first, second, and third blue filters CF1-1, CF1-2, and CF1-3 may be disposed to be spaced apart from each other in the first direction DR1.

In the case where the first, second, and third blue filters CF1-1, CF1-2, and CF1-3 are disposed to be spaced apart from each other, a first division pattern BM1 may be disposed between the first, second, and third blue filters CF1-1, CF1-2, and CF1-3. The first division pattern BM1 may prevent a light exiting from the first color filter CF1 or a light scattered by the light control portions WCL1, WCL2, and WCL3 from being incident into adjacent light control portions WCL1, WCL2, and WCL3. When the light exiting from the first color filter CF1 or the light scattered by the light control portions is incident into the second light control portion WCL2 or the third light control portion WCL3, the light may exert an influence on the color purity. The display panel DP according to the exemplary embodiment may include the first division pattern BM1, and thus, the color purity of the light may be improved. For example, when the first light is the blue light, the first division pattern BM1 may be a yellow color filter. In this case, the first division pattern BM1 may include the same material as the second color filter CF2 described below and may have an integral shape with the second color filter CF2. However, exemplary embodiments are not limited thereto or thereby.

Figure 5:
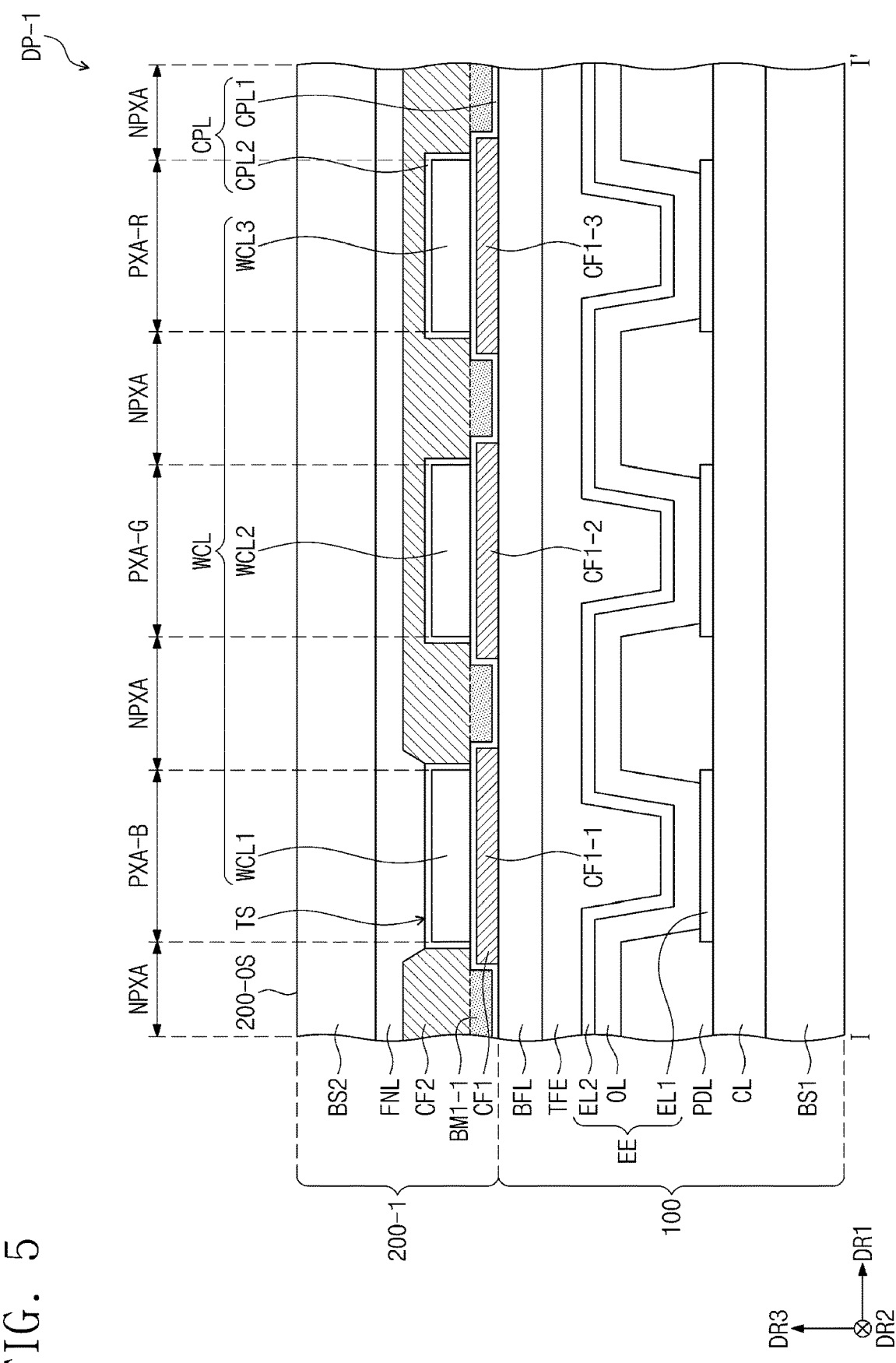

In the display panel DP-1 shown in FIG. 5, a second substrate 200-1 according to the exemplary embodiment may include a first division pattern BM1-1. The first division pattern BM1-1 may include a black-coloring agent. The first division pattern BM1-1 may include a material different from that of the second color filter CF2 and may have a shape separated from the second color filter CF2. The black-coloring agent may include a black dye or a black pigment. The black-coloring agent may include a metal material, such as a carbon black or chromium or oxides thereof.

According to another exemplary embodiment, the first, second, and third blue filters CF1-1, CF1-2, and CF1-3 may be entirely disposed on the first substrate 100 without being separated apart from each other. For example, the second blue filter CF1-2 may extend from the first blue filter CF1-1, and the third blue filter CF1-3 may extend from the second blue filter CF1-2. For example, the first, second, and third blue filters CF1-1, CF1-2, and CF1-3 may have a single-layer shape that is integrally formed.

The first electrode EL1 of each of the light emitting elements EE of the display panel DP according to the exemplary embodiment may overlap each of the first, second, and third blue filters CF1-1, CF1-2, and CF1-3 in a plan view. In detail, an area of each of the first, second, and third blue filters CF1-1, CF1-2, and CF1-3 may be greater than an area of the first electrode EL1 of each of the light emitting elements EE. Accordingly, all the light exiting from the first substrate 100 may pass through the first, second, and third blue filters CF1-1, CF1-2, and CF1-3.

The first color filter CF1 may transmit a light having a specific wavelength range. In detail, the first color filter CF1 may transmit only the first light emitted from the light emitting elements EE. For example, the first light may be the blue light, and the first color filter CF1 may include a blue-coloring agent. The blue-coloring agent may include a blue pigment or a blue dye. In the exemplary embodiment, the first color filter CF1 may transmit the blue light emitted from the light emitting elements EE, may absorb a light having a wavelength other than the blue light, and may increase the purity of the blue light. In addition, as the blue light emitted from the light emitting elements EE passes through the first color filter CF1, a band width of an emission wavelength may be narrowed. For example, the blue light having high color purity may be generated by the first color filter CF1. The blue light having the high color purity may be incident into the first, second, and third light control portions WCL1, WCL2, and WCL3 and may be converted into the blue light, the green light, and the red light by the first, second, and third light control portions WCL1, WCL2, and WCL3 to display a clear color, thereby improving the color reproducibility of the display panel DP.

The light control layer WCL may be disposed on the first color filters CF1. The light control layer WCL may control the wavelength of the first light emitted from the light emitting elements EE. The light control layer WCL may include the first light control portion WCL1, the second light control portion WCL2, and the third light control portion WCL3. The first light control portion WCL1, the second light control portion WCL2, and the third light control portion WCL3 may be respectively disposed on the first color filters CF1. Therefore, the first light emitted from the light emitting elements EE may be incident into the first light control portion WCL1, the second light control portion WCL2, and the third light control portion WCL3 after passing through the first color filters CF1.

Hereinafter, the first light, the second light, and the third light will be referred to as the blue light, the green light, and the red light, respectively. The red light may have a center wavelength equal to or greater than about 600 nm and equal to or smaller than about 670 nm, the green light may have a center wavelength equal to or greater than about 500 nm and equal to or smaller than about 580 nm, and the blue light may have a center wavelength equal to or greater than about 420 nm and equal to or smaller than about 480 nm.

The first light control portion WCL1 may include a base resin and scattering particles. The scattering particles may be distributed in the base resin. The first light control portion WCL1 does not include the quantum dot, and thus, the first light control portion WCL1 may transmit the blue light emitted from the light emitting elements EE. Since the first light control portion WCL1 does not include the quantum dot, an amount of the scattering particles per unit area included in the first light control portion WCL1 may be greater than an amount of the scattering particles per unit area included in each of the second light control portion WCL2 and the third light control portion WCL3. The scattering particles may be TiO2 or silica-based nanoparticles. However, exemplary embodiments are not limited thereto or thereby. The scattering particles may scatter the light. Thus, an optical viewing angle of the display panel DP may be improved. The descriptions about the scattering particles included in the first light control portion WCL1 may be applied to scattering particles included in the second light control portion WCL2 and the third light control portion WCL3, and thus, hereinafter, details of the scattering particles included in the second and third light control portions WCL2 and WCL3 will be omitted for descriptive convenience.

The second light control portion WCL2 may include first quantum dots, a base resin, and scattering particles. The first quantum dots and the scattering particles may be distributed in the base resin. The first quantum dots may absorb the blue light and may emit the green light. The first quantum dots may have the same function as the quantum dot included in the above-described light emitting layer, and thus, details thereof will be omitted for descriptive convenience.

The third light control portion WCL3 may include second quantum dots, a base resin, and scattering particles. The second quantum dots and the scattering particles may be distributed in the base resin. The second quantum dots may absorb the blue light and may emit the red light. The second quantum dots may have the same function as the quantum dot included in the above-described light emitting layer, and thus, details thereof will be omitted for descriptive convenience.

In the exemplary embodiment, at least a portion of the second color filter CF2 may be disposed on the light control layer WCL. The second color filter CF2 may overlap the second light control portion WCL2 and the third light control portion WCL3. The second color filter CF2 may not overlap the first light control portion WCL1. In detail, the second color filter CF2 may expose an upper surface TS of the first light control portion WCL1. In addition, according to an exemplary embodiment, the second color filter CF2 may be disposed between the first, second, and third light control portions WCL1, WCL2, and WCL3. However, exemplary embodiments are not limited thereto or thereby.

In the exemplary embodiment, the second color filter CF2 may include a yellow material. The second color filter CF2 may absorb the blue light having a color in a complementary color relationship with a yellow color and may block the transmission of the blue light. In the exemplary embodiment, the second color filter CF2 may have no polarization property or a little polarization property with respect to the red light and the green light and may have the polarization property with respect to the blue light. As the second color filter CF2 exposes the upper surface TS of the first light control portion WCL1, the blue light passing through the first light control portion WCL1 may be emitted outside the display panel DP without being absorbed by the second color filter CF2.

As the second color filter CF2 is disposed on the second light control portion WCL2 and the third light control portion WCL3, the blue light included in the light emitted from the second light control portion WCL2 and in the light emitted from the third light control portion WCL3 may be polarized and may not be emitted outside the display panel DP. The polarized blue light may be the blue light that is not converted into the green light and the red light in the second light control portion WCL2 and the third light control portion WCL3.

As the lights respectively emitted from the second light control portion WCL2 and the third light control portion WCL3 pass through the second color filter CF2, the light in the blue wavelength range may be removed, and the color purity may be improved. For example, the color purity of the green light may be improved in the light emitted from the second light control portion WCL2, and the color purity of the red light may be improved in the light emitted from the third light control portion WCL3.

Since the display panel DP according to the exemplary embodiment may include the first color filter CF1 and the second color filter CF2 respectively including materials having a complementary color relationship, an external light incident into the display panel DP may be absorbed by one of the first color filter CF1 and the second color filter CF2 while sequentially passing through the second color filter CF2 and the first color filter CF1. For example, a reflectance of the display panel DP against the external light may be reduced by the first color filters CF1 and the second color filter CF2.

Figure 6:
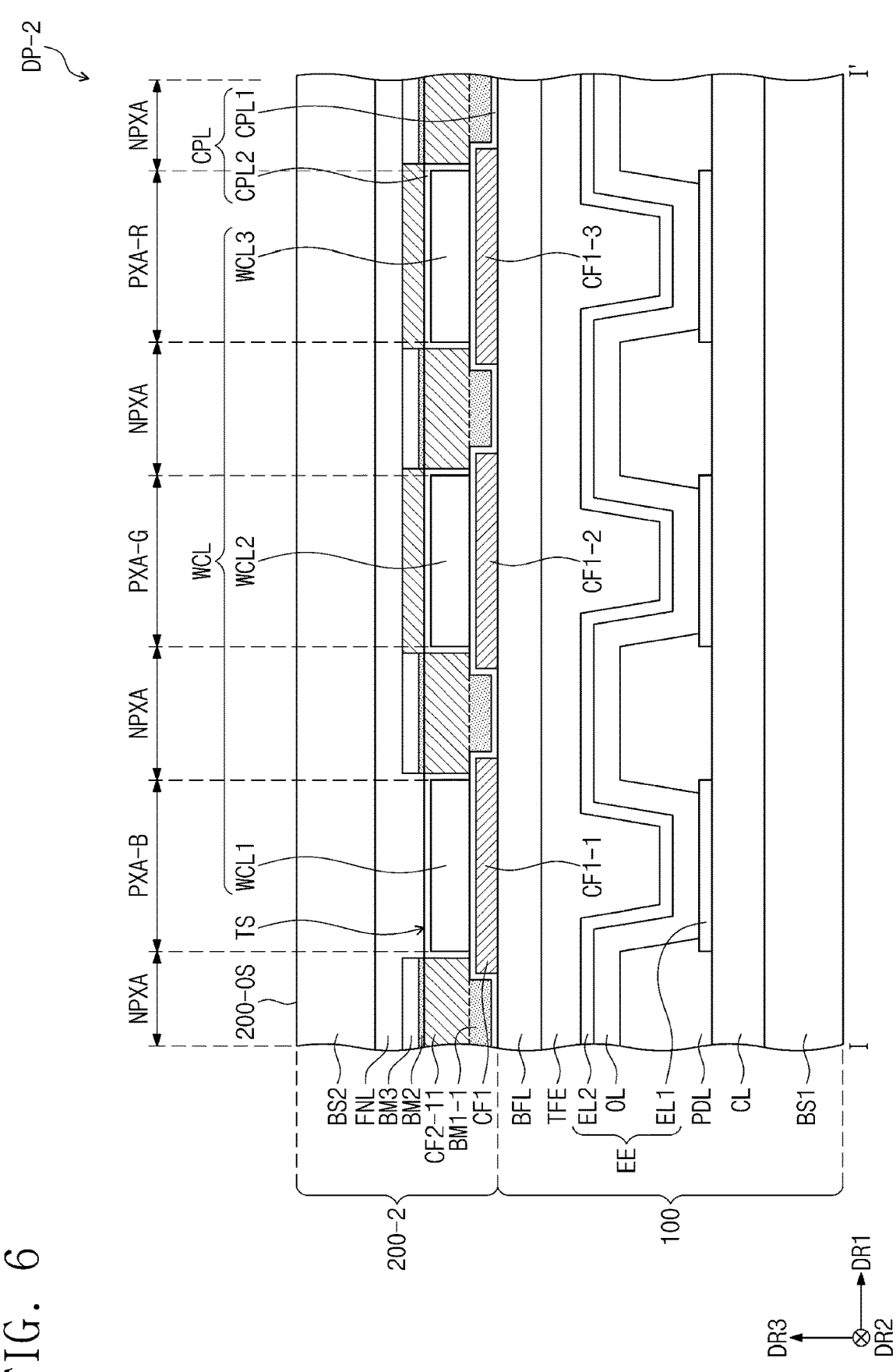

Referring to FIG. 6, in the display panel DP-2 according to an exemplary embodiment, a second substrate 200-2 may include a second division pattern BM2 and a third division pattern BM3. The second division pattern BM2 and the third division pattern BM3 may be disposed on a light control layer WCL. The second division pattern BM2 and the third division pattern BM3 may be disposed not to overlap first, second, and third light control portions WCL1, WCL2, and WCL3. For example, the second division pattern BM2 and the third division pattern BM3 may be disposed in a non-light-emitting area NPXA.

In the exemplary embodiment, the second division pattern BM2 may include a black-coloring agent, and the description of the black-coloring agent of the first division pattern BM1-1 may be equally applied to that of the second division pattern BM2.

In the exemplary embodiment, the third division pattern BM3 may include a blue-coloring agent, e.g., a blue pigment or a blue dye.

For example, the second color filter CF2-11 may be disposed between the first, second, and third light control portions WCL1, WCL2, and WCL3 and may be disposed on the second light control portion WCL2 and the third light control portion WCL3. The second color filter CF2-11 disposed between the first, second, and third light control portions WCL1, WCL2, and WCL3 may prevent the light scattered by the first, second, and third light control portions WCL1, WCL2, and WCL3 from being incident into adjacent light control portions WCL1, WCL2, and WCL3 and may prevent colors of lights from being mixed with each other.

The second color filter CF2-11 disposed on the second light control portion WCL2 and the third light control portion WCL3 may absorb blue lights that are respectively emitted from the second light control portion WCL2 and the third light control portion WCL3 and are not converted and may increase the purity of the green and red colors.

As the second color filter CF2-11 exposes an upper surface TS of the first light control portion WCL1, the blue light passing through the first light control portion WCL1 may be emitted outside the display panel DP.

FIG. 6 shows the first division pattern BM1-1 that includes a black-coloring agent. However, the first division pattern BM1-1 are not limited thereto or thereby. The first division pattern BM1-1 may include the same agent as the second color filter CF2-11. Details described with reference to FIG. 4 are also applicable to other components shown in FIG. 6.

Figure 7:
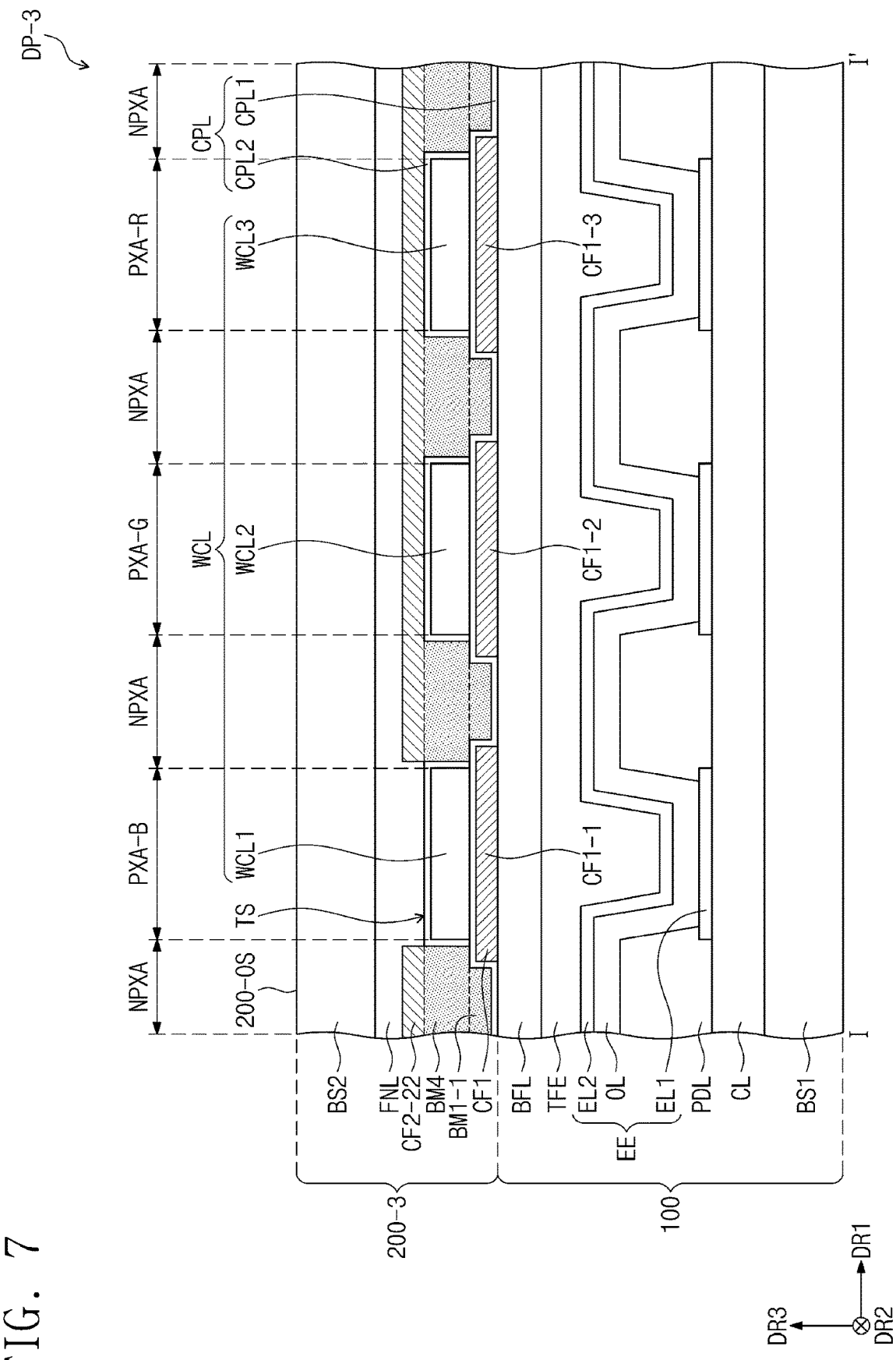

Referring to FIG. 7, in a second substrate 200-3 of the display panel DP-3 according to an exemplary embodiment, a first division pattern BM1-1 may be disposed between first color filters CF1. A fourth division pattern BM4 may be disposed between first, second, and third light control portions WCL1, WCL2, and WCL3. The fourth division pattern BM4 may include a black-coloring agent, and the description of the black-coloring agent of the first division pattern BM1-1 may be equally applied to that of the fourth division pattern BM4. The first division pattern BM1-1 and the fourth division pattern BM4 may include the same agent and may have an integral shape. In the display panel DP-3 according to the exemplary embodiment, when the first division pattern BM1-1 and the fourth division pattern BM4 exist, a second color filter CF2-22 may be disposed only on the second light control portion WCL2 and the third light control portion WCL3. Alternatively, the second color filter CF2-22 may be disposed on the fourth division pattern BM4, the second light control portion WCL2, and the third light control portion WCL3. Details described with reference to FIG. 4 are also applicable to other components shown in FIG. 7.

Figure 8:
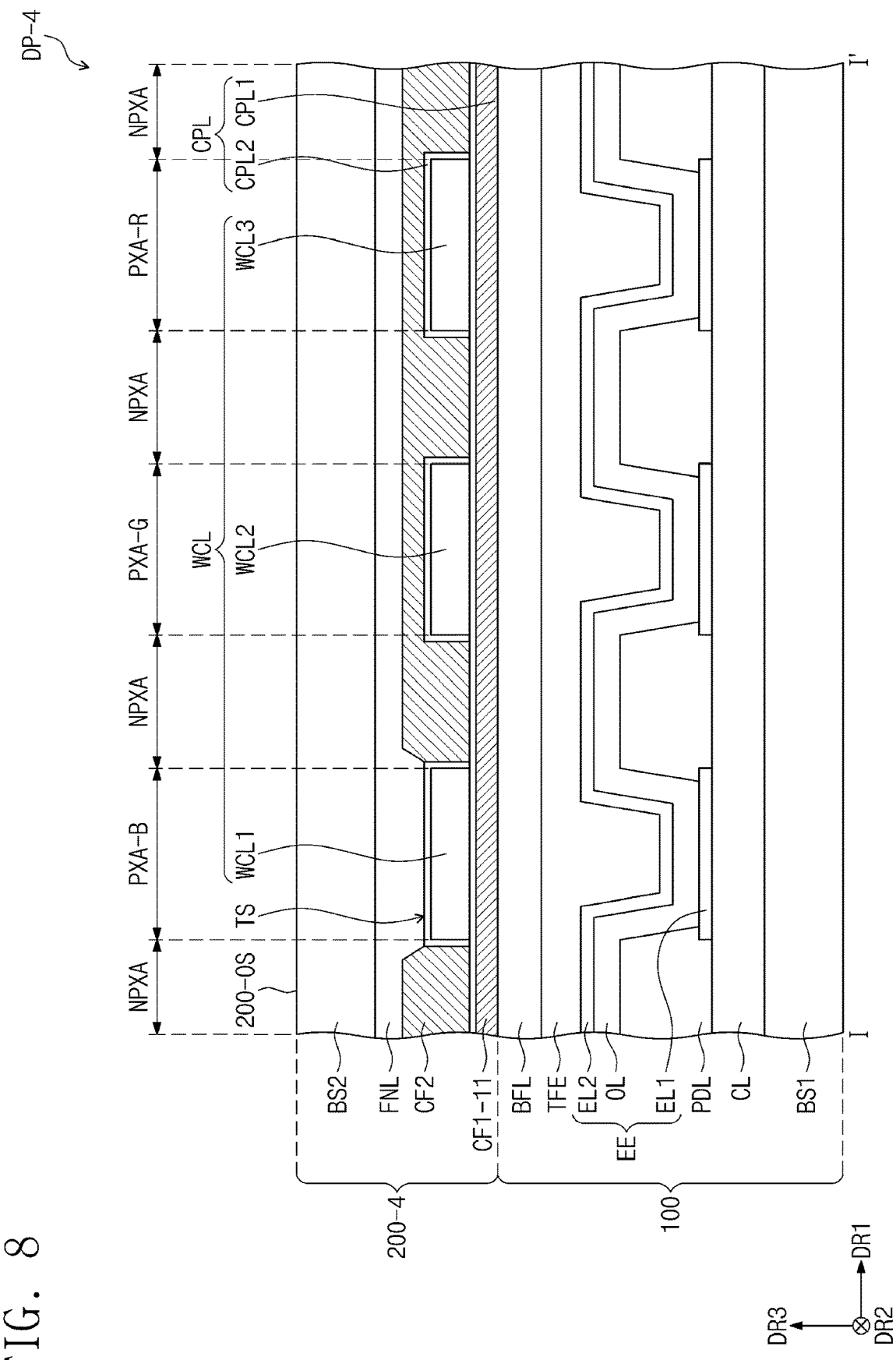

Referring to FIG. 8, in a second substrate 200-4 of the display panel DP-4 according to an exemplary embodiment, a first color filter CF1-11 may be entirely disposed on a first substrate 100. For example, the first blue filter CF1-1, the second blue filter CF1-2, and the third blue filter CF1-3 may be connected to each other to have an integral shape. Details described with reference to FIG. 4 are also applicable to other components shown in FIG. 8.

Figure 9:
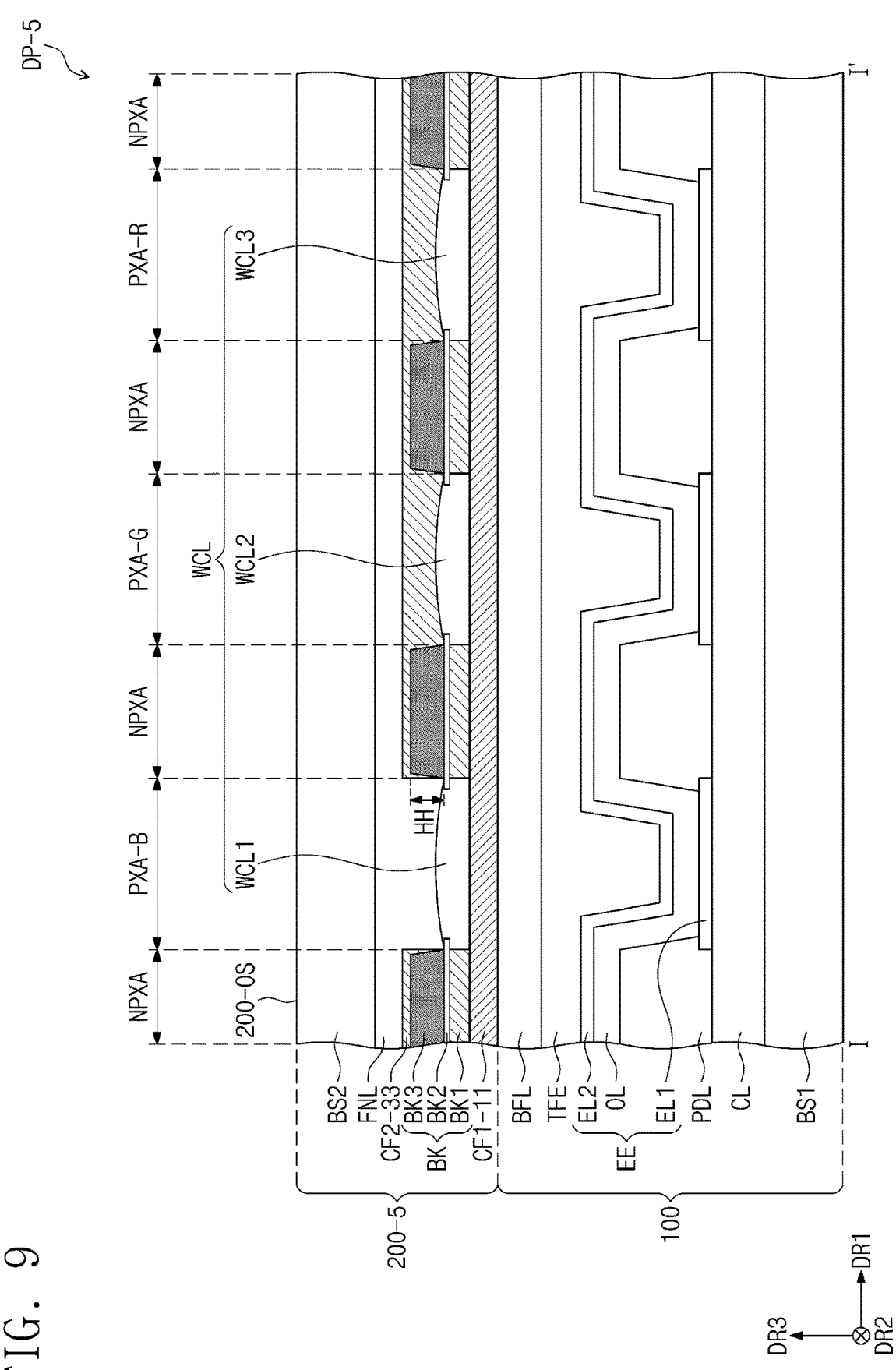

Referring to FIG. 9, a second substrate 200-5 of the display panel DP-5 according to an exemplary embodiment may further include a barrier wall BK. The barrier wall BK may be disposed on a first color filter CF1-11 and may be disposed to overlap a non-light-emitting area NPXA. A second color filter CF2-33 may be disposed on the barrier wall BK.

In the exemplary embodiment, the barrier wall BK may include a first barrier wall BK1, a second barrier wall BK2, and a third barrier wall BK3. The first barrier wall BK1, the second barrier wall BK2, and the third barrier wall BK3 may be sequentially stacked on the first color filter CF1-11 in the third direction DR3.

In the exemplary embodiment, the first barrier wall BK1 may include the same material as the second color filter CF2-33. The second barrier wall BK2 may be an inorganic layer containing an inorganic material. In detail, the second barrier wall BK2 may include silicon nitride (SiNx) or silicon oxide (SiOx). For example, the second barrier wall BK2 may include silicon oxide (SiOx). The third barrier wall BK3 may include an organic layer. At least a portion of the second barrier wall BK2 may be inserted into each of first, second, and third light control portions WCL1, WCL2, and WCL3. However, exemplary embodiments are not limited thereto or thereby.

The barrier wall BK may prevent colors of lights emitted from the first, second, and third light control portions WCL1, WCL2, and WCL3 from being mixed with each other and may increase the purity of the lights. For example, the color reproducibility of the display panel DP-5 may be improved.

In an exemplary embodiment, the display panel DP may include a first base substrate BS1, a circuit layer CL, a plurality of light emitting elements EE, a thin film encapsulation layer TFE, a buffer layer BFL, a first color filter CF1, a light control layer WCL, a second color filter CF2, a functional layer FNL, and a second base substrate BS2, which are sequentially stacked one on another through successive processes.

According to another exemplary embodiment, the display panel DP may be manufactured by assembling a first substrate 100 and a second substrate 200, which are formed separately from each other. In detail, the first substrate 100 may be formed by sequentially stacking a circuit layer CL, a plurality of light emitting elements EE, a thin film encapsulation layer TFE, and a buffer layer BFL on a first base substrate BS1 through successive processes. The second substrate 200 may be formed by sequentially stacking a functional layer FNL, a second color filter CF2, a light control portion WCL, and a first color filter CF1 on a second base substrate BS2 through successive processes.

FIGS. 10A to 10I are views illustrating a method of manufacturing a second substrate of the display panel of FIG. 1A. This is the manufacturing method of the second substrate 200 according to an exemplary embodiment. However, the manufacturing method of the second substrate 200 is not limited thereto.

Figure 10A:
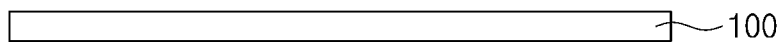
FIGS. 10A, 10B, 10C, 10D, 10E, 10F, 10G, 10H, and 10I are cross-sectional views illustrating a method of manufacturing a second substrate of the display panel of FIG. 1A.
Figure 10B:
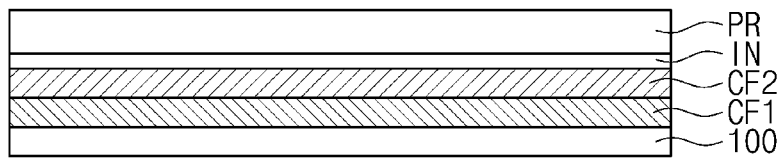

FIG. 10A shows an operation of preparing the first substrate 100. The first substrate 100 may include a synthetic resin substrate or a glass substrate. FIG. 10B shows an operation of sequentially forming a first color filter CF1, a second color filter CF2, an inorganic layer IN, and a photoresist PR on the first substrate 100. In detail, the first color filter CF1 and the second color filter CF2 may be formed by a photolithography process. The inorganic layer IN may be formed by depositing an inorganic material, such as silicon nitride (SiNx) or silicon oxide (SiOx). The photoresist PR may be deposited by a spin-coating method.

Figure 10C:
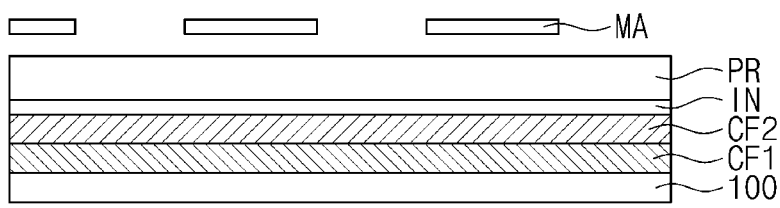

FIG. 10C shows an operation of exposing the deposited photoresist. In detail, a mask pattern MA is formed and a light is irradiated onto the photoresist PR. The photoresist PR may be a positive type photoresist. However, exemplary embodiments are not limited thereto or thereby. A photolithography process, such as a developing process and a baking process, may be carried out after the exposure process.

Figure 10D:
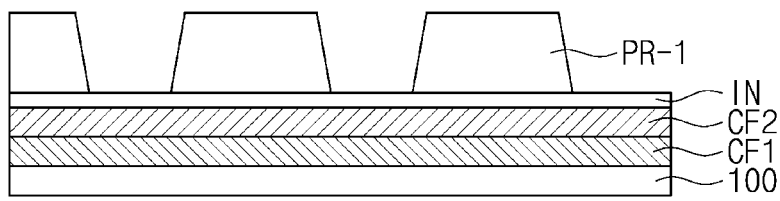

FIG. 10D shows a first pattern photoresist PR-1 formed using the mask pattern MA.

Figure 10E:
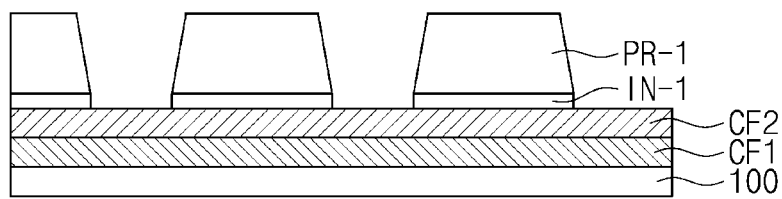

FIG. 10E shows a dry-etching operation on the inorganic layer IN of FIG. 10D to form an etched inorganic layer IN-1. The etched inorganic layer IN-1 may overlap the first pattern photoresist PR-1.

Figure 10F:
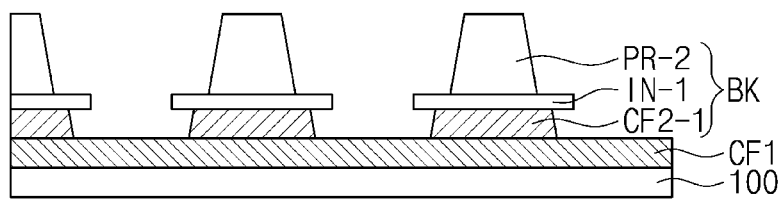

FIG. 10F shows a dry-ashing operation on the first pattern photoresist PR-1 of FIG. 10E to form a second pattern photoresist PR-2 and a dry-ashing operation on the second color filter CF2 of FIG. 10E to form a pattern color filter CF-1. In the exemplary embodiment, the first pattern photoresist PR-1 and the second color filter CF2 may be substantially simultaneously ashed. For example, the second pattern photoresist PR-2 and the pattern color filter CF-1 may be substantially simultaneously formed.

The above-described barrier wall BK may include the pattern color filter CF2-1, the etched inorganic layer IN-1, and the second pattern photoresist PR-2, which are sequentially stacked in the third direction DR3. In detail, the pattern color filter CF2-1 may be substantially the same as the first barrier wall BK1. Descriptions about the first barrier wall BK1 may be equally applied to the pattern color filter CF2-1. The etched inorganic layer IN-1 may be substantially the same as the above-described second barrier wall BK2. Descriptions about the second barrier wall BK2 may be equally applied to the etched inorganic layer IN-1.

The second pattern photoresist PR-2 may be substantially the same as the above-described third barrier wall BK3. Descriptions about the third barrier wall BK3 may be equally applied to the second pattern photoresist PR-2. In addition, a height of the third barrier wall BK3 may be adjusted by adjusting a height of the photoresist PR deposited in the operation shown FIG. 10B. Accordingly, the height of the barrier wall BK may be controlled.

Figure 10G:
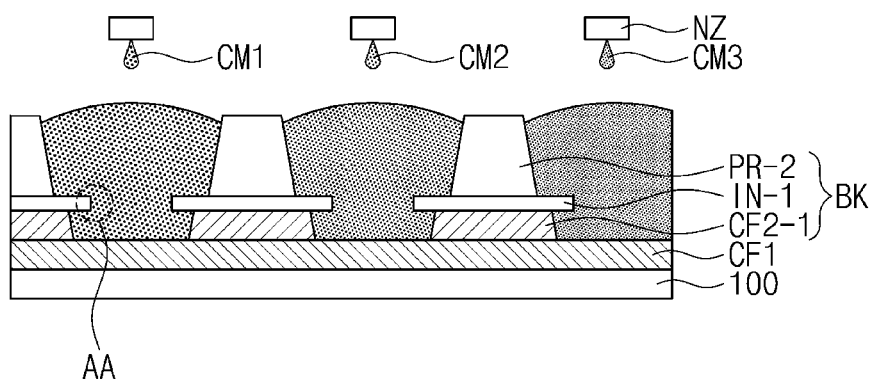

FIG. 10G shows an operation of spraying a first composition material CM1, a second composition material CM2, and a third composition material CM3 between the barrier walls BK through a nozzle NZ using an inkjet printing method. The first composition material CMI may include first quantum dots, a base resin, scattering particles, and a solvent. In the exemplary embodiment, the first quantum dots may absorb the blue light and may emit the green light. The second composition material CM2 may include second quantum dots, a base resin, scattering particles, and a solvent. In the exemplary embodiment, the second quantum dots may absorb the blue light and may emit the red light. The third composition material CM3 may include a base resin, scattering particles, and a solvent.

Referring to an area AA, both ends of the etched inorganic layer IN-1 may be covered by the first composition material CM1, the second composition material CM2, and the third composition material CM3. This structure may be formed according to the manufacturing order of the second substrate 200.

Figure 10H:
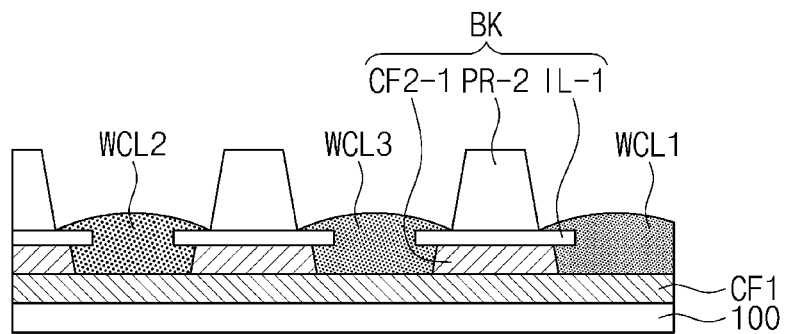

FIG. 10H shows an operation of baking the first composition material CM1, the second composition material CM2, and the third composition material CM3. The solvent may be removed from each of the first composition material CM1, the second composition material CM2, and the third composition material CM3 through the baking process. In the exemplary embodiment, when the solvent is removed from the first composition material CM1, the above-described second light control portion WCL2 may be formed. In the exemplary embodiment, when the solvent is removed from the second composition material CM2, the above-described third light control portion WCL3 may be formed. When the solvent is removed from the third composition material CM3, the above-described first light control portion WCL1 may be formed. The arrangement order of the first, second, and third light control portions WCL1, WCL2, and WCL3 are not limited thereto or thereby.

At least a portion of the etched inorganic layer IN-1 may be inserted into the first, second, and third light control portions WCL1, WCL2, and WCL3 in the area AA as shown in FIG. 10G.

Figure 10I:
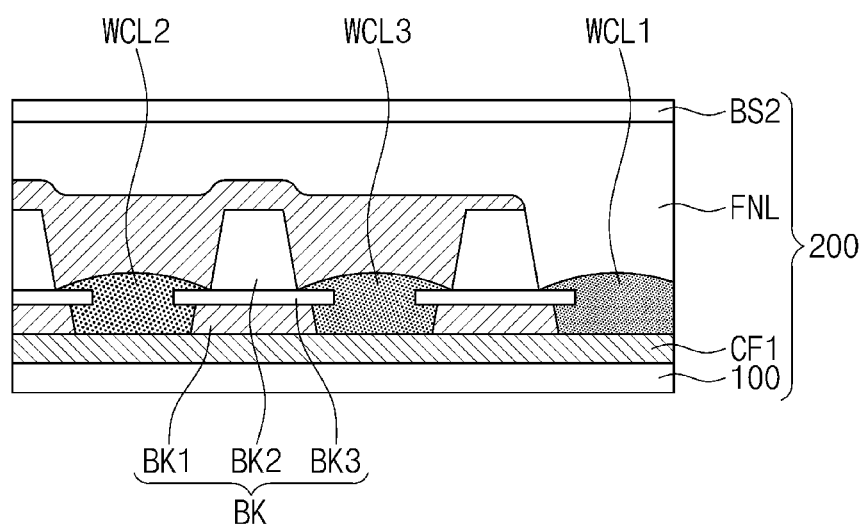

FIG. 10I shows an operation of forming the second color filter CF2, a functional layer FNL, and a second base substrate BS2 on the barrier wall BK to form the second substrate 200. The second color filter CF2 may expose the first light control portion WCL1. The functional layer FNL may be disposed on the second color filter CF2 and the first light control portion WCL1 to provide a flat surface on the glass substrate. In the exemplary embodiment, the function layer FNL may include an organic material.

The second base substrate BS2 may be disposed on the functional layer FNL. In the exemplary embodiment, the first color filter CF1, the second base substrate BS2, and the components therebetween may be stacked on the first substrate 100 to form the second substrate 200.

Figure 11:
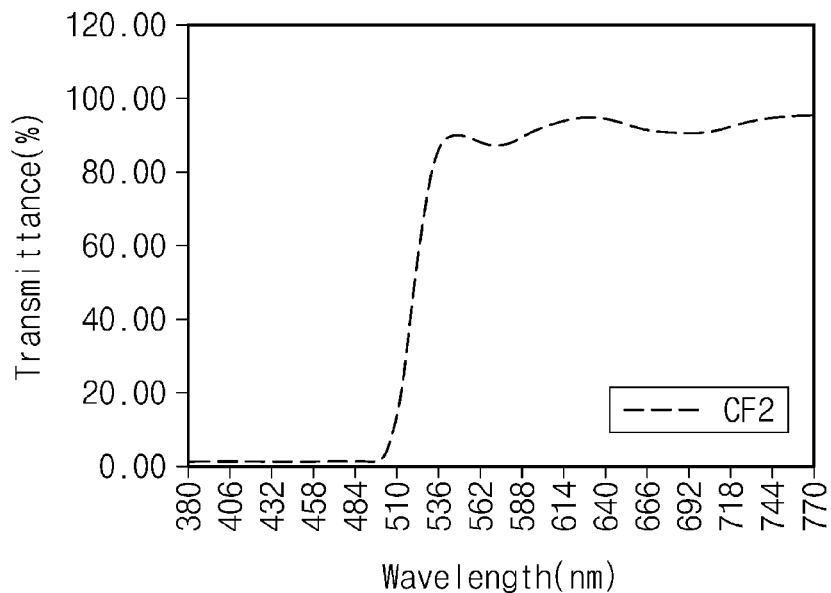
FIG. 11 is a graph illustrating a variation of a transmittance as a function of a wavelength of a second color filter of the display panel of FIG. 1A.
Figure 12:
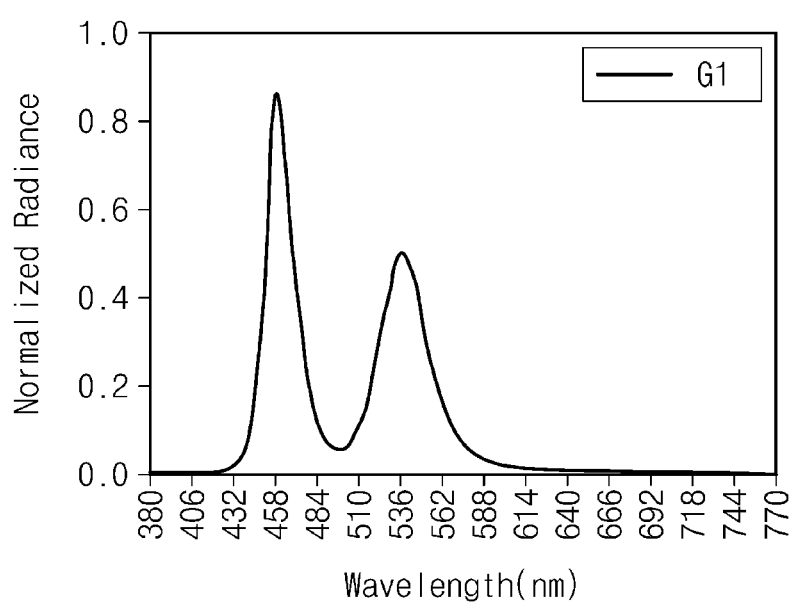
FIG. 12 is a graph illustrating a light emitting spectrum of a light generated by the display panel of FIG. 1A after the light passes through a second light control portion thereof.
Figure 13:
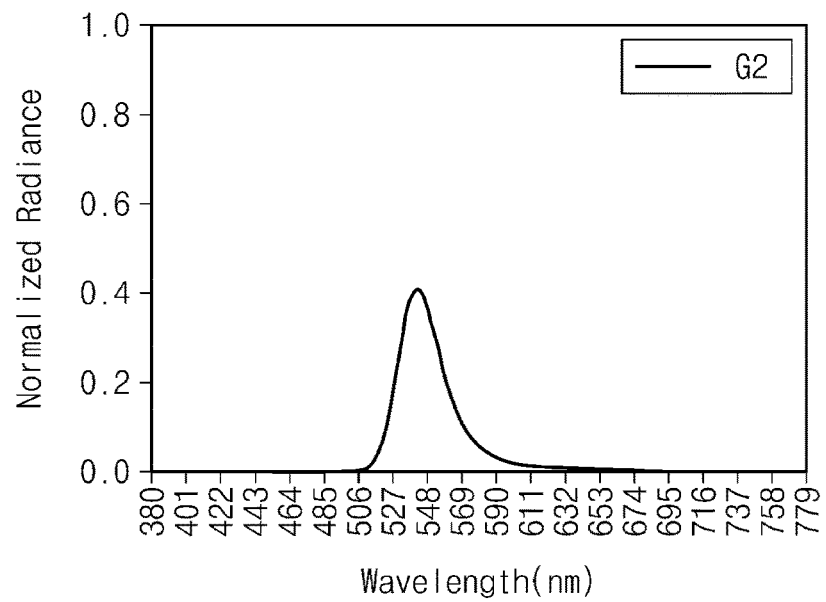
FIG. 13 is a graph illustrating a light emitting spectrum of the light of the display panel of FIG. 8 after the light passes through the second color filter thereof.
Figure 14:
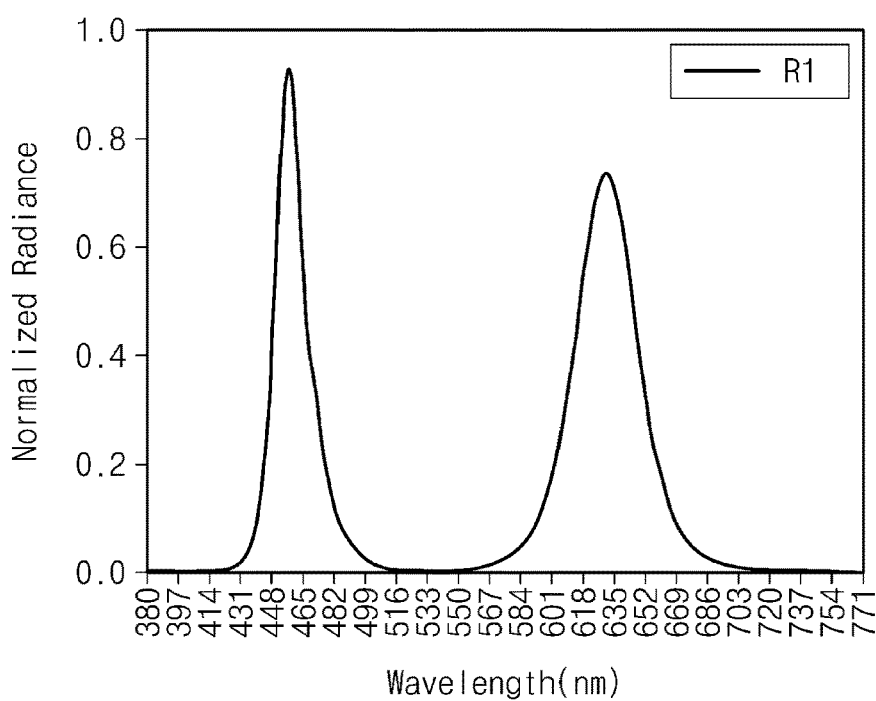
FIG. 14 is a graph illustrating a light emitting spectrum of a light generated by the display panel of FIG. 1A after the light passes through a third light control portion thereof.
Figure 15:
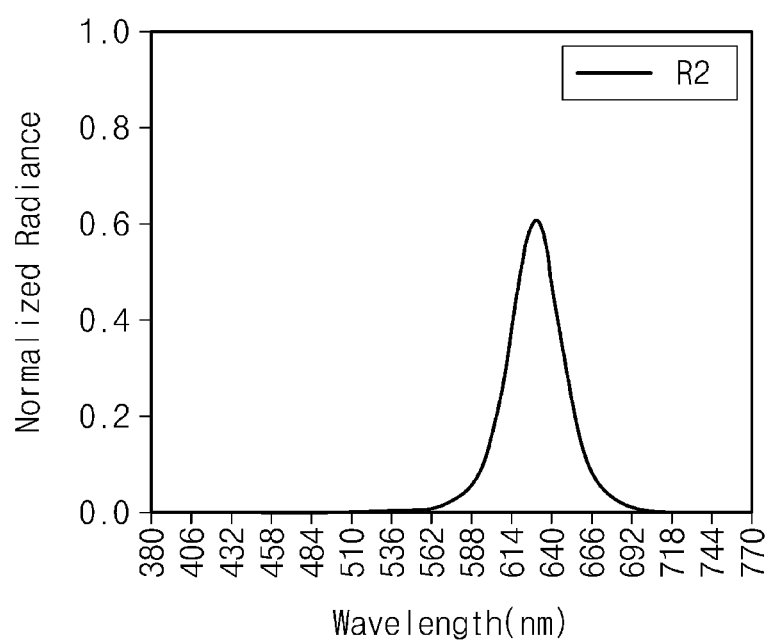
FIG. 15 is a graph illustrating a light emitting spectrum of the light of FIG. 14 after the light passes through the second color filter of the display panel of FIG. 1A.

FIG. 11 is a graph illustrating a variation of a transmittance (%) as a function of a wavelength of the second color filter CF2 of the display panel DP according to an exemplary embodiment. FIG. 12 is a graph illustrating a normalized radiance of a light emitting spectrum of the light generated by the display panel DP after the light passes through the second light control portion WCL2 according to an exemplary embodiment. FIG. 13 is a graph illustrating a light emitting spectrum of the light of FIG. 12 after the light passes through the second color filter CF2. FIG. 14 is a graph illustrating a light emitting spectrum of the light generated by the display panel DP after the light passes through the third light control portion WCL3 according to an exemplary embodiment. FIG. 15 is a graph illustrating a light emitting spectrum of the light of FIG. 14 after the light passes through the second color filter CF2.

Referring to FIG. 11, the second color filter CF2 has a transmittance with respect to the blue light, which is very lower than that with respect to the green light and the red light. In detail, the second color filter CF2 has a transmittance of about zero (0) with respect to a light having a center wavelength equal to or greater than about 420 nm and equal to or smaller than about 480 nm. The second color filter CF2 has the transmittance equal to or greater than about 80% with respect to a light having a center wavelength equal to or greater than about 500 nm and equal to or smaller than about 580 nm and a light having a center wavelength equal to or greater than about 600 nm and equal to or smaller than about 670 nm. In the exemplary embodiment, the light having a center wavelength equal to or greater than about 420 nm and equal to or smaller than about 480 nm may be blocked by the second color filter CF2. For example, the light having the center wavelength equal to or greater than about 420 nm and equal to or smaller than about 480 nm of the light emitted from the display panel may not pass through the second color filter CF2.

Referring to FIGS. 12 and 13, the light passing through the second light control portion WCL2 may include the green light having the center wavelength in the vicinity of about 540 nm and the blue light having the center wavelength in the vicinity of about 460 nm. The green light may be obtained by converting the blue light by the first quantum dot included in the second light control portion WCL2. The blue light may be the light provided from the first color filters CF1, which is not converted. When the light of FIG. 12 passes through the second color filter CF2, the light having the center wavelength equal to or greater than about 420 nm and equal to or smaller than about 480 nm may be removed. For example, the second color filter CF2 may remove the blue light from the light passing through the second light control portion WCL2 and thus may increase the purity of the green light.

Referring to FIGS. 14 and 15, the light passing through the third light control portion WCL3 may include the red light having the center wavelength in the vicinity of about 630 nm and the blue light having the center wavelength in the vicinity of about 450 nm. The red light may be obtained by converting the blue light by the second quantum dot included in the third light control portion WCL3. The blue light may be the light provided from the first color filters CF1, which is not converted. When the light of FIG. 14 passes through the second color filter CF2, the light having the center wavelength equal to or greater than about 420 nm and equal to or smaller than about 480 nm may be removed. For example, the second color filter CF2 may remove the blue light from the light passing through the third light control portion WCL3 and thus may increase the purity of the red light.

The display panel DP may include the first color filter CF1, the light control layer WCL, and the second color filter CF2 having the color in a complementary color relationship with the color of the first color filter CF1, which are sequentially stacked one on another. Thus, the purity of the color emitted from the light control layer WCL may increase, and also the reflectance of the external light may be reduced.

Figure 16B:
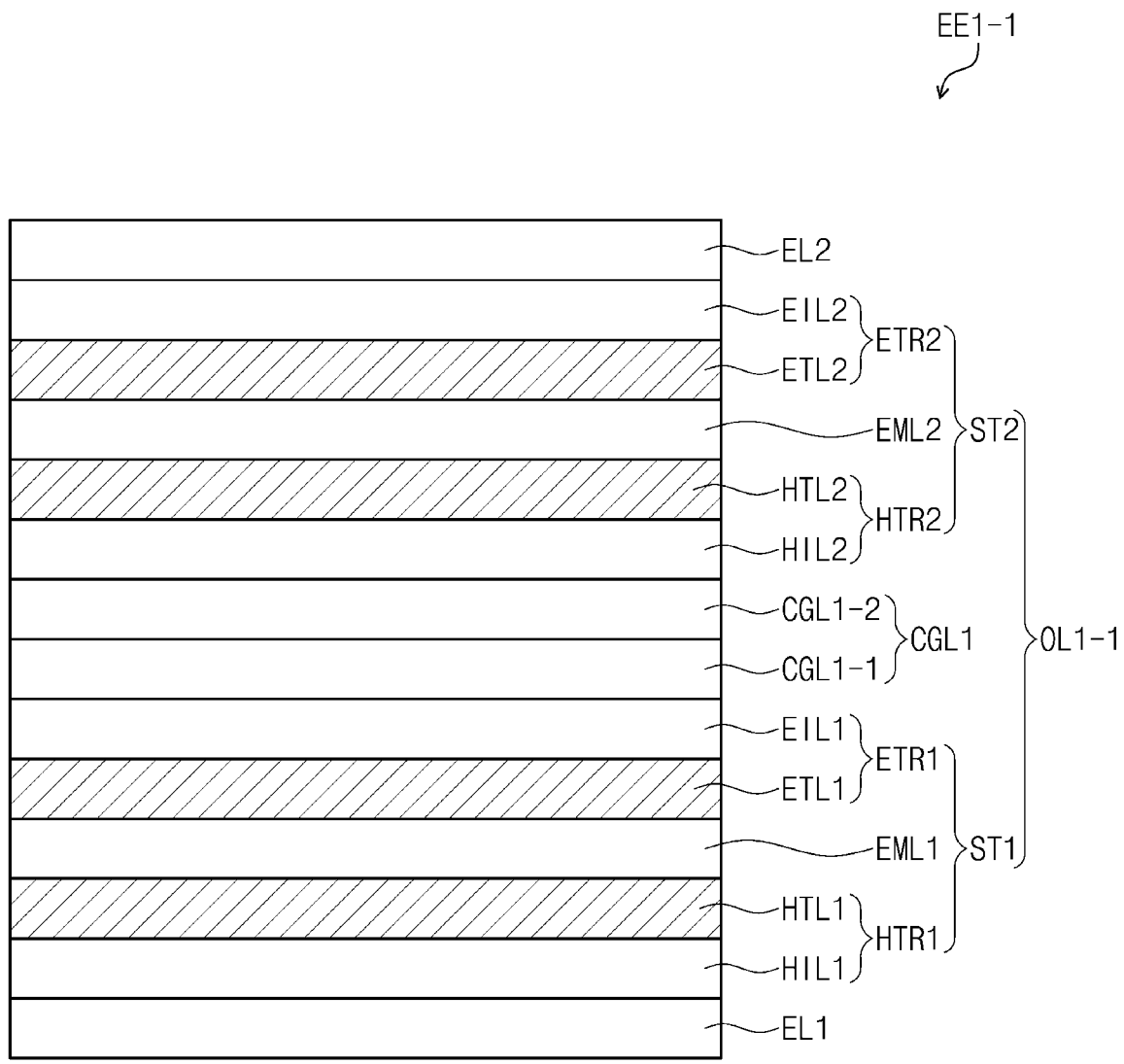
FIG. 16B is a cross-sectional view of a light emitting element of the display panel of FIG. 16A.

FIG. 16A is a cross-sectional view taken along a line I-I' of FIG. 3 illustrating a display panel DP-6, and FIG. 16B is a cross-sectional view of a light emitting element EE1-1 shown in FIG. 16A.

Hereinafter, the descriptions with reference to FIGS. 1 to 9 may be applied to the same elements as those shown in FIGS. 1 to 9. In addition, the capping layers CPL1 and CPL2 (refer to FIGS. 4 to 9) are omitted, however, the capping layers may be added as necessary.

Referring to FIGS. 16A and 16B, the light emitting element EE1-1 may include a first electrode EL1, an organic layer OL1-1, and a second electrode EL2. The organic layer OL1-1 may include a first stack ST1 and a second stack ST2, which are disposed above the first electrode EL1. A first charge generating layer CGL1 may be disposed between the first stack ST1 and the second stack ST2.

The first stack ST1 may include a first light emitting layer EML1 emitting a light, a first hole transport region HTR1 transporting holes provided from the first electrode EL1 to the first light emitting layer EML1, and a first electron transport region ETR1 transporting electrons provided from the first charge generating layer CGL1 to the first light emitting layer EML1.

The descriptions on the light emitting layer described with reference to FIGS. 4 to 9 may be equally applied to the first light emitting layer EML1. For example, the first light emitting layer EML1 may emit a first light.

FIG. 16B shows a structure in which the first hole transport region HTR1 includes a first hole injection layer HIL1 and a first hole transport layer HTL1. However, exemplary embodiments are not limited thereto or thereby, and one of the first hole injection layer HIL1 and the first hole transport layer HTL1 may be omitted. In an exemplary embodiment, the first hole transport region HTR1 may include only the first hole injection layer HIL1, and the first hole injection layer HIL1 may be in contact with the first light emitting layer EML1.

FIG. 16B shows a structure in which the first electron transport region ETR1 includes a first electron injection layer EIL1 and a first electron transport layer ETL1. However, exemplary embodiments are not limited thereto or thereby, and one of the first electron injection layer EIL1 and the first electron transport layer ETL1 may be omitted. In an exemplary embodiment, the first electron transport region ETR1 may include only the first electron transport layer ETL1, and the first electron transport layer ETL may be in contact with the first light emitting layer EML1 and the first charge generating layer CGL1.

The second stack ST2 may include a second light emitting layer EML2 emitting a light, a second hole transport region HTR2 transporting holes provided from the first charge generating layer CGL1 to the second light emitting layer EML2, and a second electron transport region ETR2 transporting electrons generated by the second electrode EL2 to the second light emitting layer EML2.

The second light emitting layer EML2 may emit a second light. The descriptions about the first light emitting layer EML1 may be equally applied to the second light emitting layer EML2.

The descriptions about the first hole transport region HTR1 may be equally applied to the second hole transport region HTR2. In addition, the descriptions about the first electron transport region ETR1 may be equally applied to the second electron transport region ETR2.

Each layer of the first hole transport region HTR1 and the second hole transport region HTR2 may be formed using conventional methods known in the art. For example, the first hole transport region HTR1 and the second hole transport region HTR2 may be formed using various methods, such as a vacuum deposition method, a spin coating method, a cast method, an Langmuir-Blodgett (LB) method, an inkjet printing method, a laser printing method, a laser-induced thermal imaging (LITI) method, or the like.

Each layer of the first electron transport region ETR1 and the second electron transport region ETR2 may be formed using conventional methods known in the art. For example, the first electron transport region ETR1 and the second electron transport region ETR2 may be formed using various methods, such as a vacuum deposition method, a spin coating method, a cast method, an Langmuir-Blodgett (LB) method, an inkjet printing method, a laser printing method, a laser-induced thermal imaging (LITI) method, or the like.

The first charge generating layer CGL1 may be provided between the first stack ST1 and the second stack ST2. When a voltage is applied, the first charge generating layer CGL1 may form a complex through an oxidation-reduction reaction, and thus may generate charges (electrons and holes). In addition, the first charge generating layer CGL1 may provide the generated charges to each of the stacks ST1 and ST2 adjacent thereto. The first charge generating layer CGL1 may double the efficiency of current generated in the stacks ST1 and ST2 and may adjust a balance of the charges between the first stack ST1 and the second stack ST2.

The first charge generating layer CGL1 may have a layer structure in which a first sub-charge generating layer CGL1-1 and a second sub-charge generating layer CGL1-2 are attached to each other. As an example, the first sub-charge generating layer CGL1-1 may be an n-type charge generating layer that is disposed adjacent to the first stack ST1 and provides electrons to the first stack ST1. The second sub-charge generating layer CGL1-2 may be a p-type charge generating layer that is disposed adjacent to the second stack ST2 and provides holes to the second stack ST2. A buffer layer may be further disposed between the first sub-charge generating layer CGL1-1 and the second sub-charge generating layer CGL1-2.

The first light emitting layer EML1 and the second light emitting layer EML2 may emit lights in various wavelength ranges. In the exemplary embodiment, the first light emitting layer EML1 may emit a first light, and the second light emitting layer EML2 may emit a second light. The light emitting element EE1-1 according to the exemplary embodiment may have a stack structure in which the first light emitting layer EML1 and the second light emitting layer EML2 are stacked one on another and may emit a light obtained by mixing the first light with the second light as a light source.

Referring to FIG. 16A again, the display panel DP-6 may emit the first light and the second light using the light emitting element EE1-1. Hereinafter, the light obtained by mixing the first light with the second light will be referred to as a "first mixed light". In the exemplary embodiment, the first light may be the blue light. The first light may have a center wavelength equal to or greater than about 420 nm and equal to or smaller than about 480 nm.

In the exemplary embodiment, the second light may be the green light. The second light may have a center wavelength equal to or greater than about 500 nm and equal to or smaller than about 580 nm.

The first mixed light may have the center wavelength equal to or greater than about 420 nm and equal to or smaller than about 480 nm and the center wavelength equal to or greater than about 500 nm and equal to or smaller than about 580 nm. However, exemplary embodiments are not limited thereto or thereby, and the center wavelength of the first mixed light may be changed depending on the wavelength range of the first and second lights.

The first mixed light may be emitted from a first substrate 100-1 and may be incident to a second substrate 200-6. A portion of the first mixed light incident to the second substrate 200-6 may be incident to the second light control portion WCL2, may pass through the second color filter CF2, and may exit to the outside of the display panel DP-6.

In the second substrate 200-6 according to the exemplary embodiment, a first opening OP1 may be defined through a second blue filter CF1-2'. The first opening OP1 may penetrate through the second blue filter CF1-2'. The first opening OP1 may be applied without being particularly limited as long as the first opening OP1 is defined at a position overlapping the second light control portion WCL2.

The second light control portion WCL2 and the second color filter CF2 may be sequentially stacked on the second blue filter CF1-2'. As described above, the second light control portion WCL2 may convert a wavelength of the light incident thereto to a wavelength range of the green light using a quantum dot. The second color filter CF2 may have the transmittance as a function of the wavelength shown in FIG. 11. For example, the transmittance of the second color filter CF2 with respect to the blue light may be significantly lower than the transmittance of the second color filter CF2 with respect to the green light and the red light.

The first mixed light may pass through the second light control portion WCL2 and the second color filter CF2 after passing through the second blue filter CF1-2' according to a position at which the first mixed light is incident to the second substrate 200-6. As another way, the first mixed light may pass through the second light control portion WCL2 and the second color filter CF2 after passing through the first opening OP1.

FIG. 16A shows the display panel DP-6 according to the exemplary embodiment, however, the structure of the display panel DP-6 may be changed in various ways as long as the first opening OP1 is defined. For example, the shape of the first color filter CF1-11, the shape of the first to fourth division patterns BM1 to BM5, and the shape of the barrier wall BK of the display panels DP to DP-5 shown in FIGS. 4 to 9 may be applied to the display panel DP-6 shown in FIG. 16A.

FIGS. 17A to 17D are graphs illustrating a spectrum of the first mixed light generated by the display panel of FIG. 16A.

Hereinafter, a variation in spectrum of the first mixed light is described with reference to FIGS. 17A to 17D when the first mixed light sequentially passes through the second blue filter CF1-2', the second light control portion WCL2, and the second color filter CF2.

Figure 17A:
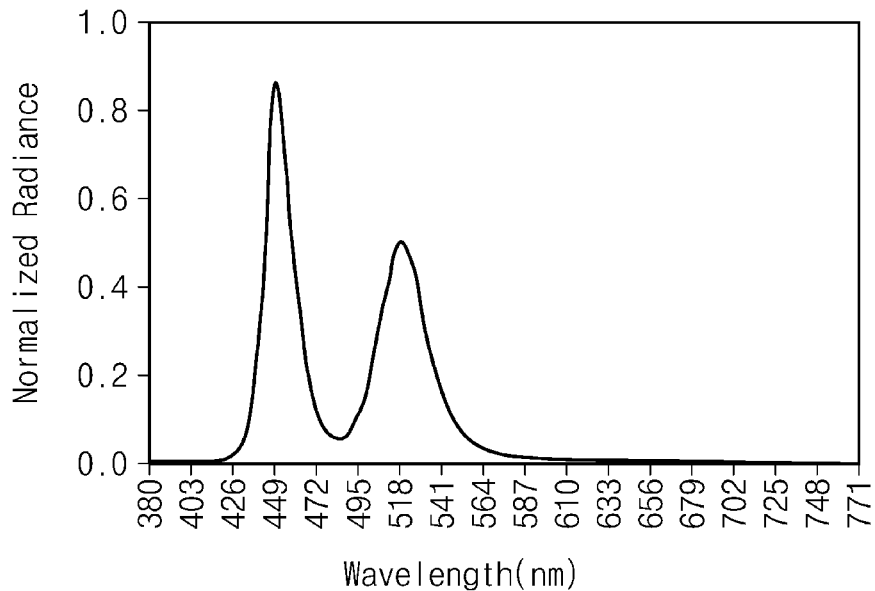
FIGS. 17A, 17B, 17C, and 17D are graphs illustrating spectrums of a first mixed light generated by the display panel of FIG. 16A.

FIG. 17A shows the spectrum of the first mixed light that is emitted from the first substrate 100-1 according to the exemplary embodiment. As shown in FIG. 17A, the first mixed light may have the center wavelength equal to or greater than about 420 nm and equal to or smaller than about 480 nm and the center wavelength equal to or greater than about 500 nm and equal to or smaller than about 580 nm.

Figure 17B:
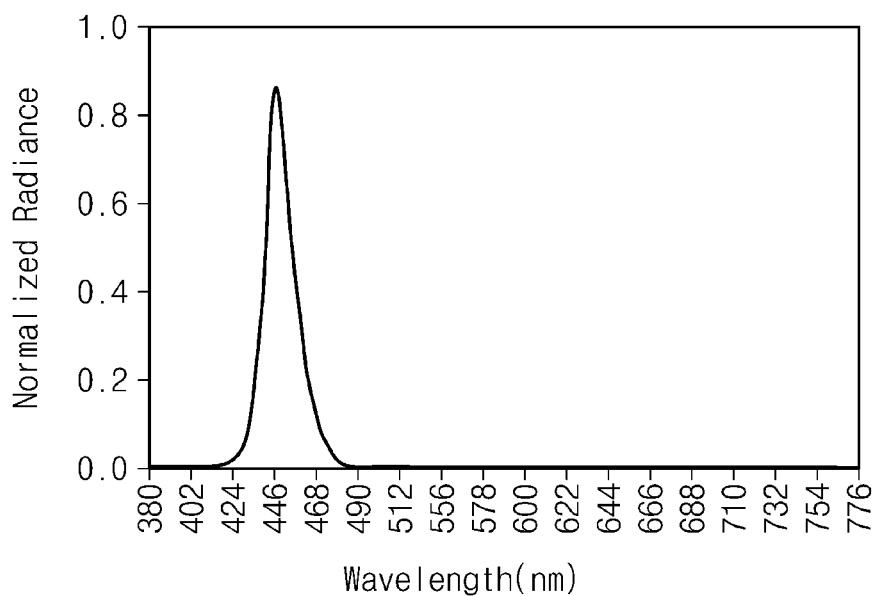

FIG. 17B shows the spectrum of the first mixed light that was emitted from the first substrate 100-1 and passed through the second blue filter CF1-2'. As shown in FIG. 17B, the first mixed light that passed through the second blue filter CF1-2' may have the center wavelength equal to or greater than about 420 nm and equal to or smaller than about 480 nm. The second light may be removed from the first mixed light of FIG. 17A by the second blue filter CF1-2', and the first light may remain. The first light may be the blue light.

Figure 17C:
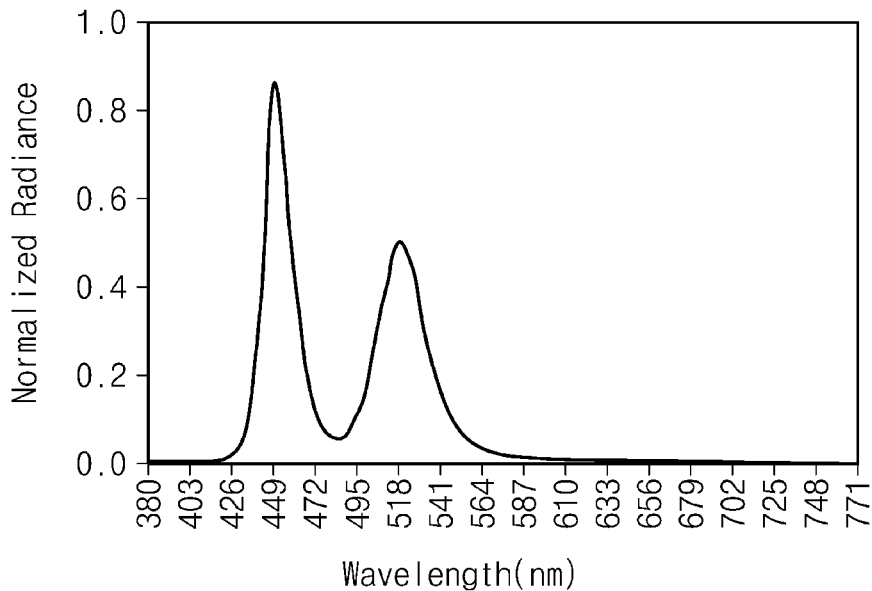

FIG. 17C shows the spectrum of the first mixed light that sequentially passed the second blue filter CF1-2' and the second light control portion WCL2. FIG. 17C shows the spectrum of the light of FIG. 17B that passed through the second light control portion WCL2.

As shown by the spectrum of FIG. 17C, the light of the FIG. 17C may have the center wavelength equal to or greater than about 420 nm and equal to or smaller than about 480 nm and the center wavelength equal to or greater than about 500 nm and equal to or smaller than about 580 nm. For example, the wavelength of the light of FIG. 17B may be changed while passing through the second light control portion WCL2. A portion of the light of FIG. 17B may be converted to the green light. The other portion of the light of FIG. 17B may remain as the blue light without being converted to the green light.

Figure 17D:
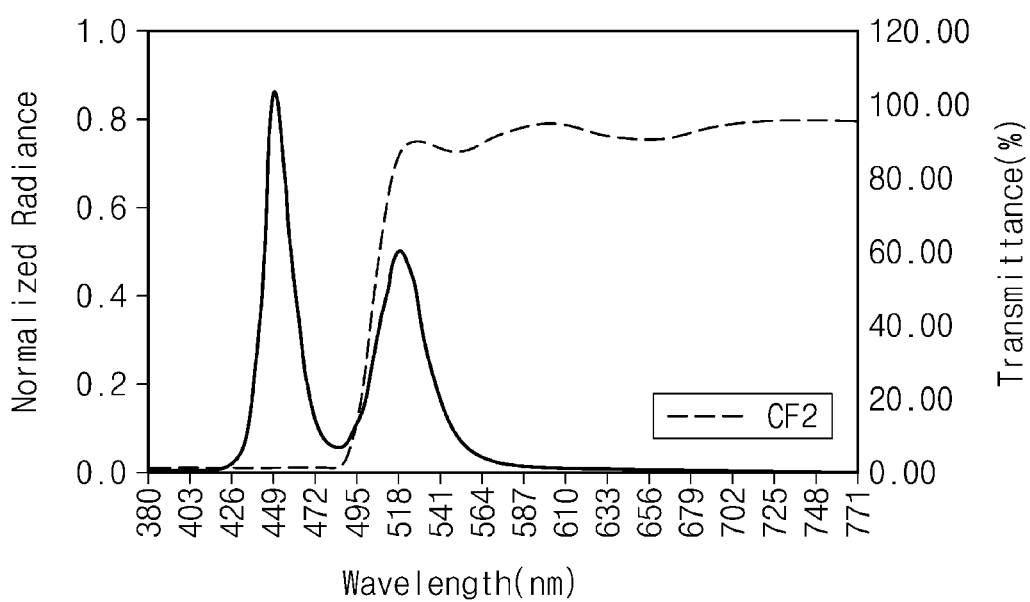

FIG. 17D shows the spectrum of the first mixed light that sequentially after passed through the second blue filter CF1-2', the second light control portion WCL2, and the second color filter CF2. In addition, the transmittance of the second color filter CF2 for each wavelength is shown by a dotted line in FIG. 17D. The transmittance of the second color filter CF2 with respect to the blue light is significantly lower than the transmittance of the second color filter CF2 with respect to the green light and the red light.

As shown in FIG. 17D, the light corresponding to the wavelength range of the blue light may be removed from the light shown by the spectrum of FIG. 17C by the second color filter CF2 according to the transmittance of the second color filter CF2.

Accordingly, the spectrum of FIG. 17D may correspond to the spectrum of the green light having the center wavelength equal to or greater than about 500 nm and equal to or smaller than about 580 nm.

Referring to FIG. 17D, the first mixed light emitted from the first substrate 100-1 may sequentially pass through the second blue filter CF1-2', the second light control portion WCL2, and the second color filter CF2, and thus may be converted to have the wavelength range of the green light.

FIGS. 18A to 18D are graphs illustrating a spectrum of the first mixed light generated by another example of the display panel of FIG. 16A.

Hereinafter, a variation in spectrum of the first mixed light is described with reference to FIGS. 18A to 18D when the first mixed light sequentially passes through the first opening OP1, the second light control portion WCL2, and the second color filter CF2.

Figure 18A:
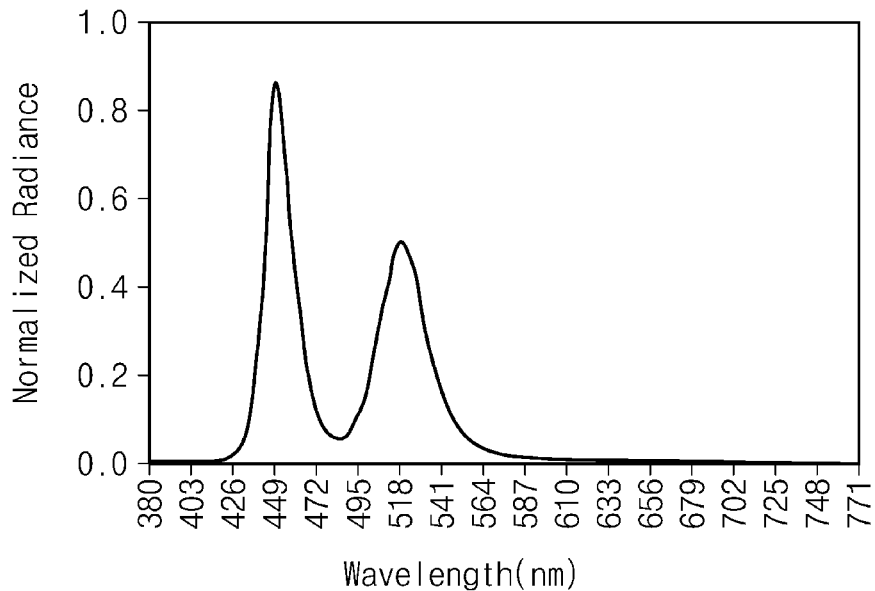
FIGS. 18A, 18B, 18C, and 18D are graphs illustrating spectrums of a first mixed light generated by another example of the display panel of FIG. 16A.

FIG. 18A shows the spectrum of the first mixed light that is emitted from the first substrate 100-1 according to the exemplary embodiment. As shown in FIG. 18A, the first mixed light may have the center wavelength equal to or greater than about 420 nm and equal to or smaller than about 480 nm and the center wavelength equal to or greater than about 500 nm and equal to or smaller than about 580 nm.

Figure 18B:
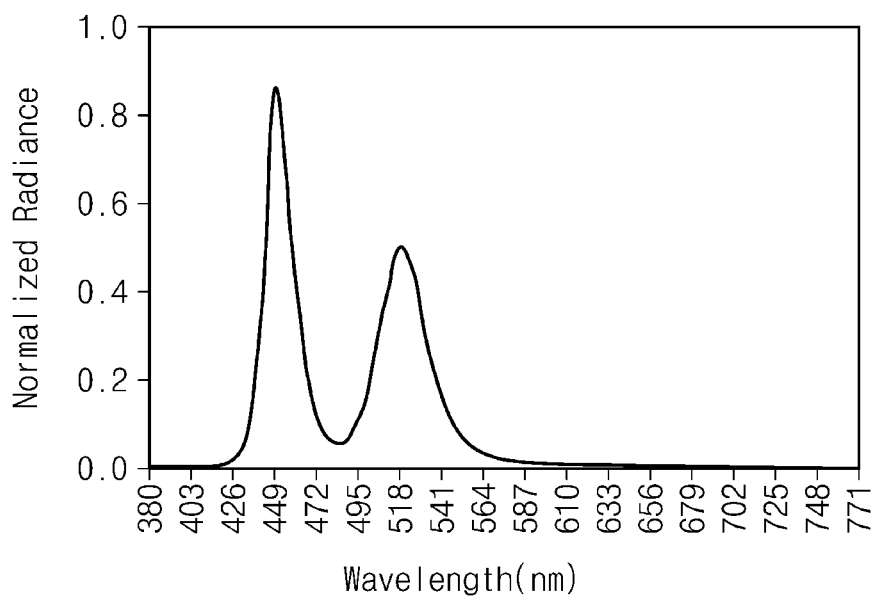

FIG. 18B shows the spectrum of the first mixed light that was emitted from the first substrate 100-1 and passed through the first opening OP1. The spectrum shown in FIG. 18B is substantially the same as the spectrum shown in FIG. 18A. The first mixed light may pass through the first opening OP1 without any change in wavelength. For example, the second light included in the first mixed light may be incident to the second light control portion WCL2 without being removed by the second blue filter CF1-2'.

Figure 18C:
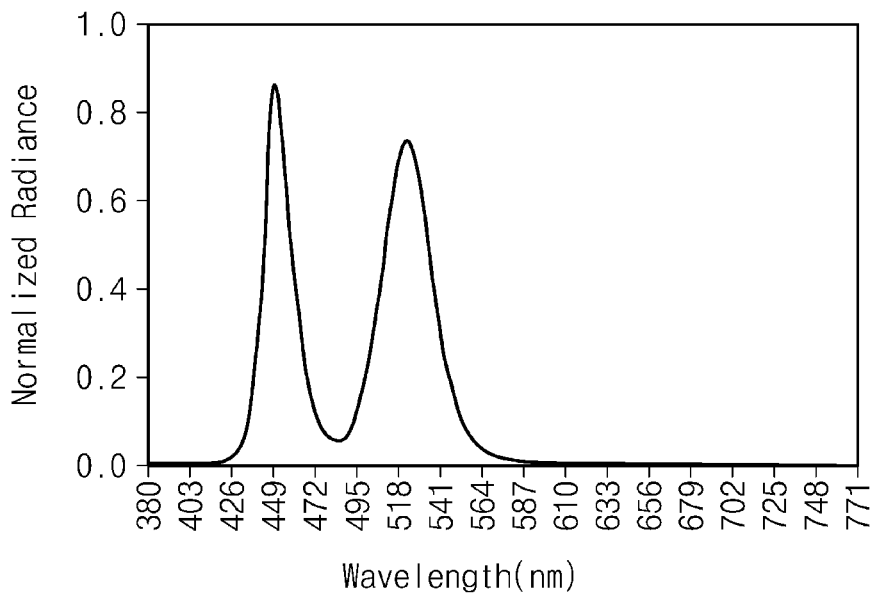

FIG. 18C shows the spectrum of the first mixed light that passed through the second light control portion WCL2 after exiting from the first opening OP1. As shown by the spectrum of FIG. 18C, the first mixed light may have the center wavelength equal to or greater than about 420 nm and equal to or smaller than about 480 nm and the center wavelength equal to or greater than about 500 nm and equal to or smaller than about 580 nm.

A portion of the blue light of the first mixed light incident to the second light control portion WCL2 may be converted to the green light due to the quantum dot of the second light control portion WCL2. Accordingly, the green light included in the first mixed light that is a light source is added to the green light generated by the second light control portion WCL2, and thus, an amount of the green light generated by the display panel may increase. As shown in FIG. 18C, a luminance in the wavelength equal to or greater than about 500 nm and equal to or smaller than about 580 nm may increase compared with the spectrum of FIG. 18B.

Figure 18D:
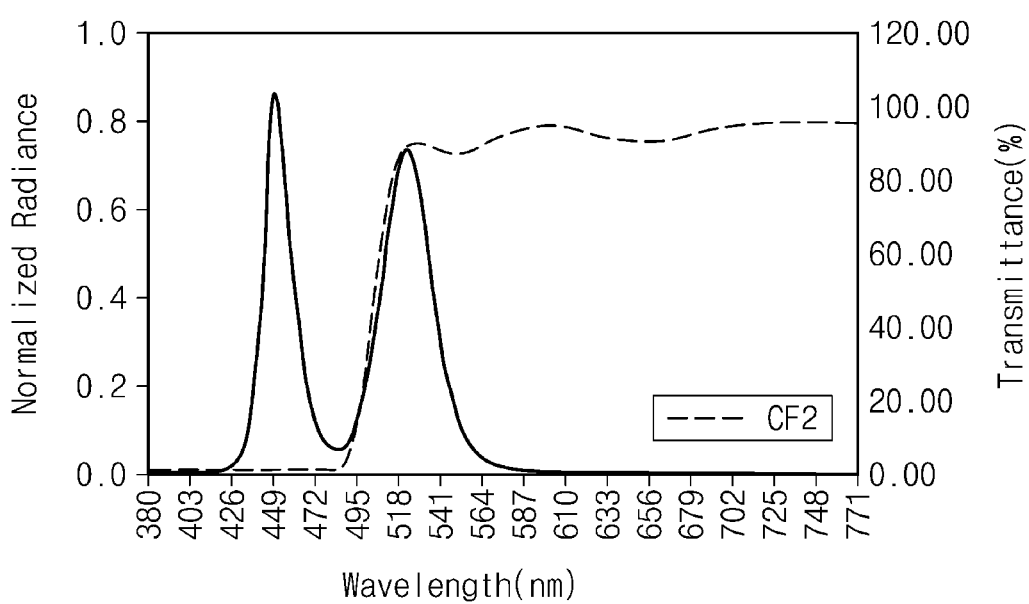

FIG. 18D shows the spectrum of the first mixed light that sequentially passed through the first opening OP1, the second light control portion WCL2, and the second color filter CF2. In addition, the transmittance of the second color filter CF2 for each wavelength is shown by a dotted line in FIG. 18D. The transmittance of the second color filter CF2 with respect to the blue light is significantly lower than the transmittance of the second color filter CF2 with respect to the green light and the red light.

As shown in FIG. 18D, the light corresponding to the wavelength range of the blue light may be removed from the light shown by the spectrum of FIG. 18C by the second color filter CF2 according to the transmittance of the second color filter CF2.

Referring to FIGS. 17D and 18D, the normalized radiance of the wavelength equal to or greater than about 500 nm and equal to or smaller than about 580 nm in FIG. 18D may be higher than the normalized radiance of the wavelength equal to or greater than about 500 nm and equal to or smaller than about 580 nm in FIG. 17D.

The display panel DP-6 according to the exemplary embodiment may include the first opening OP1 defined through the second blue filter CF1-2' to emit the green light included in the light source and may emit the green light generated by converting the blue light using the second light control portion WCL2, and thus may display the image in which the luminance of the green light increases.

Figure 19A:
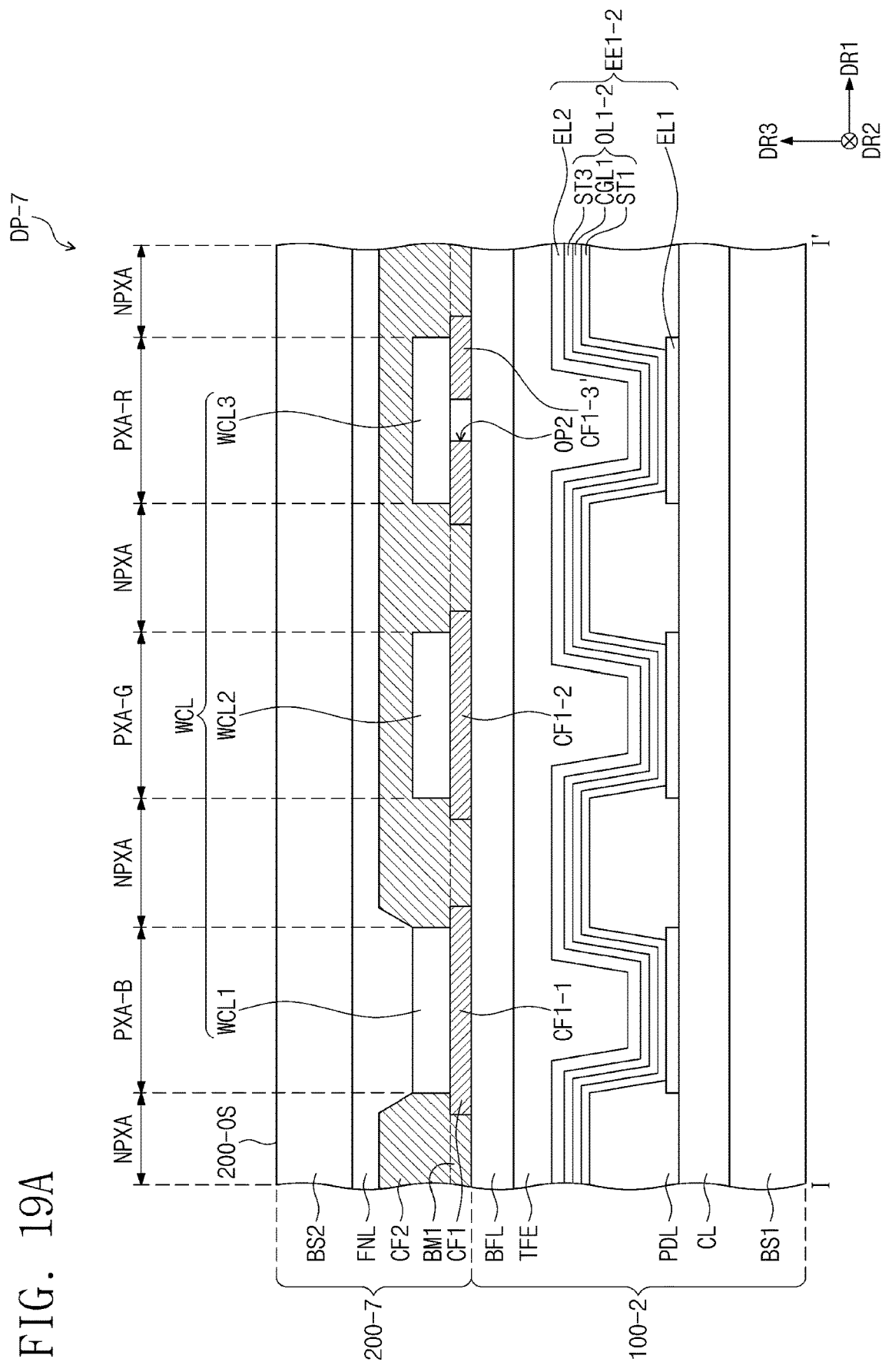
FIG. 19A is a cross-sectional view taken along a line I-I' of FIG. 3 illustrating another exemplary embodiment of the display panel of FIG. 1A.
Figure 19B:
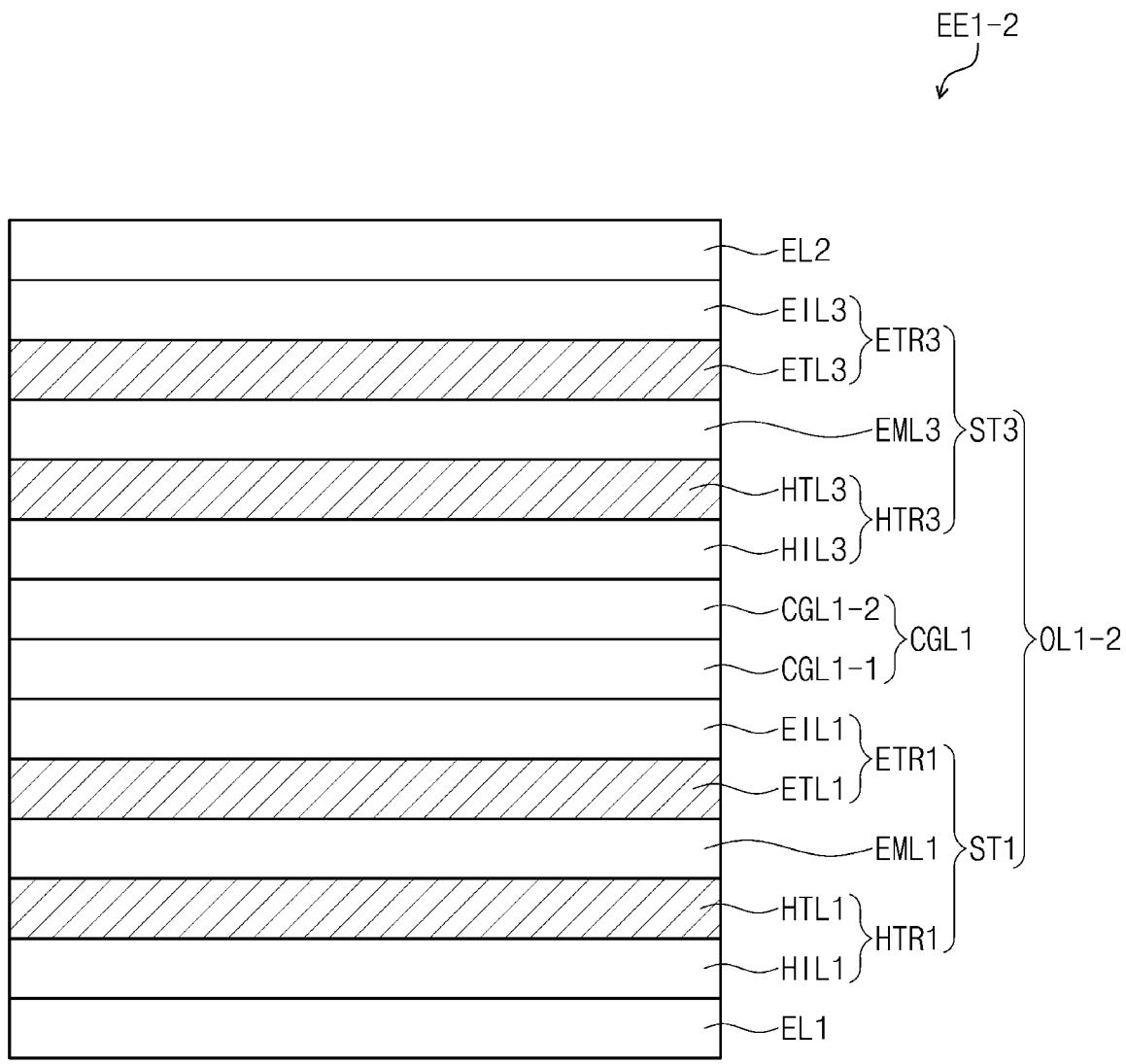
FIG. 19B is a cross-sectional view of a light emitting element of the display panel of FIG. 19A.

FIG. 19A is a cross-sectional view taken along a line I-I' of FIG. 3 illustrating a display panel DP-7, and FIG. 19B is a cross-sectional view of a light emitting element EE1-2 shown in FIG. 19A.

Hereinafter, the descriptions described with reference to FIGS. 1 to 18D may be equally applied to the same elements in FIGS. 19A and 19B as those in FIGS. 1 to 18D.

Referring to FIGS. 19A and 19B, the light emitting element EE1-2 may include a first electrode ELL an organic layer OL1-2, and a second electrode EL2. The organic layer OL1-2 may include a first stack ST1 and a third stack ST3, which are disposed above the first electrode EL1. A first charge generating layer CGL1 may be disposed between the first stack ST1 and the third stack ST3.

The third stack ST3 may include a third light emitting layer EML3 emitting a light, a third hole transport region HTR3 transporting holes provided from the first charge generating layer CGL1 to the third light emitting layer EML3, and a third electron transport region ETR3 transporting electrons generated by the second electrode EL2 to the third light emitting layer EML3.

The third light emitting layer of the exemplary embodiment may emit a third light.

The descriptions of the first light emitting layer EML1 may be equally applied to the third light emitting layer EML3. The descriptions of the first hole transport region HTR1 may be equally applied to the third hole transport region HTR3. In addition, the descriptions of the first electron transport region ETR1 may be equally applied to the third electron transport region ETR3.

Referring to FIG. 19A again, the light emitting element EE1-2 of the display panel DP-7 may emit the first light and the third light as described above. Hereinafter, a light obtained by mixing the first light and the third light may be referred to as a "second mixed light". In an exemplary embodiment, the first light may be a blue light. The first light may have a center wavelength equal to or greater than about 420 nm and equal to or smaller than about 480 nm.

In the exemplary embodiment, the third light may be a red light. The third light may have a center wavelength equal to or greater than about 600 nm and equal to or smaller than about 670 nm.

The second mixed light may have the center wavelength equal to or greater than about 420 nm and equal to or smaller than about 480 nm and the center wavelength equal to or greater than about 600 nm and equal to or smaller than about 670 nm. However, exemplary embodiments are not limited thereto or thereby, and the center wavelength of the second mixed light may be changed depending on the wavelength range of the first and third lights.

The second mixed light may be emitted from a first substrate 100-2 and may be incident to a second substrate 200-7. A portion of the second mixed light incident to the second substrate 200-7 may be incident to the third light control portion WCL3, may pass through the second color filter CF2, and may exit to the outside of the display panel DP-7.

In the second substrate 200-7 according to the exemplary embodiment, a second opening OP2 may be defined through a third blue filter CF1-3'. The second opening OP2 may penetrate through the third blue filter CF1-3'. The second opening OP2 may be applied without being particularly limited as long as the second opening OP2 is defined at a position overlapping the third light control portion WCL3.

The third light control portion WCL3 and the second color filter CF2 may be sequentially stacked on the third blue filter CF1-3'. As described above, the third light control portion WCL3 may convert a wavelength of the light incident thereto to a wavelength range of the red light using a quantum dot. The second color filter CF2 may have the transmittance as a function of the wavelength shown in FIG. 11. For example, the transmittance of the second color filter CF2 with respect to the blue light may be significantly lower than the transmittance of the second color filter CF2 with respect to the green light and the red light.

The second mixed light may pass through the third light control portion WCL3 and the second color filter CF2 after passing through the third blue filter CF1-3' according to a position at which the second mixed light is incident to the second substrate 200-7. As another way, the second mixed light may pass through the third light control portion WCL3 and the second color filter CF2 after passing through the second opening OP2.

The second opening OP2 may perform substantially the same function as that of the first opening OP1 described with reference to FIGS. 17A to 17D and FIG. 18A to 18D. For example, the display panel DP-7 according to the exemplary embodiment may include the second opening OP2 defined through the third blue filter CF1-3' and may emit the red light included in the light source to the outside of the display panel DP-7. In addition, the red light generated by converting the blue light using the third light control portion WCL3 may exit to the outside of the display panel DP-7. Accordingly, the display panel DP-7 in which the second opening OP2 is defined may display an image in which a luminance of the red light increases by adding the red light included in the light source to the red light generated by the third light control portion WLC3.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
   a first substrate comprising a plurality of light emitting elements to emit a first light; and
   a second substrate disposed on the first substrate, the second substrate comprising:
   a first color filter comprising a first blue filter, a second blue filter, and a third blue filter disposed on the first substrate;
   a light control layer comprising a first light control portion to transmit the first light and disposed on the first blue filter, a second light control portion to convert the first light to a second light and disposed on the second blue filter, and a third light control portion to convert the first light to a third light and disposed on the third blue filter; and
   a second color filter exposing an upper surface of the first light control portion and covering the second light control portion and the third light control portion.

2. The display panel of claim 1, wherein the first blue filter, the second blue filter, and the third blue filter are disposed to be spaced apart from each other, and the second substrate further comprises a first division pattern disposed between the first blue filter, the second blue filter, and the third blue filter.

3. The display panel of claim 2, wherein the first division pattern comprises a same material as the second color filter.

4. The display panel of claim 2, wherein the first division pattern comprises a black-coloring agent.

5. The display panel of claim 1, further comprising a second division pattern and a third division pattern, which are disposed above the light control layer and do not overlap the first light control portion, the second light control portion, and the third light control portion, wherein:
   the second division pattern comprises a black-coloring agent, and
   the third division pattern is disposed on the second division pattern and comprises a blue-coloring agent.

6. The display panel of claim 1, wherein each of the plurality of light emitting elements comprises a first electrode, a second electrode, and an organic layer disposed between the first and second electrodes, the organic layer comprising a first light emitting layer to generate the first light.

7. The display panel of claim 6, wherein:
the first electrode of each of the plurality of light emitting elements overlaps each of the first blue filter, the second blue filter, and the third blue filter, and
an area of each of the first blue filter, the second blue filter, and the third blue filter in a plan view is greater than an area of the first electrode in a plan view.

8. The display panel of claim 6, wherein:
the organic layer further comprises a second light emitting layer to emit the second light,
the second blue filter is provided with a first opening defined therethrough, and
the first opening overlaps the second light control portion.

9. The display panel of claim 6, wherein:
the organic layer further comprises a third light emitting layer to emit the third light,
the third blue filter is provided with a second opening defined therethrough, and
the second opening overlaps the third light control portion.

10. The display panel of claim 1, wherein:
each of the first blue filter, the second blue filter, and the third blue filter is configured to transmit the first light, and
the second color filter comprises a material to absorb the first light.

11. The display panel of claim 1, wherein:
the first light is a blue light,
the second light is a green light, and
the third light is a red light.

12. The display panel of claim 1, wherein the second color filter is configured to transmit the second light and the third light.

13. The display panel of claim 1, wherein:
the second blue filter extends from the first blue filter, and
the third blue filter extends from the second blue filter.

14. The display panel of claim 13, further comprising a barrier wall that does not overlap the first light control portion, the second light control portion, and the third light control portion and is disposed between the first color filter and the second color filter, wherein:
the barrier wall comprises a first barrier wall, a second barrier wall, and a third barrier wall, which are sequentially stacked,
the first barrier wall comprises a same material as the second color filter,
the second barrier wall comprises an inorganic material, and
the third barrier wall comprises an organic material.

15. A display panel comprising:
a first color filter disposed to overlap a first light emitting area, a second light emitting area, and a third light emitting area;
a first light control portion overlapping the first light emitting area and disposed on the first color filter;
a second light control portion overlapping the second light emitting area and disposed on the first color filter;
a third light control portion overlapping the third light emitting area and disposed on the first color filter; and
a second color filter disposed on the first color filter and covering the second light control portion and the third light control portion, wherein:
a first light emitting element is disposed in the first light emitting area,
a second light emitting element is disposed in the second light emitting area,
a third light emitting element is disposed in the third light emitting area,
the first light emitting element, the second light emitting element, and the third light emitting element are configured to emit a first light, and
a non-light-emitting area is defined adjacent to the first light emitting area, the second light emitting area, and the third light emitting area.

16. A display panel comprising:
a first substrate comprising a plurality of light emitting elements to emit a first light; and
a second substrate disposed on the first substrate and comprising a light emitting area in which the light emitting elements are disposed and a non-light-emitting area defined adjacent to the light emitting area, the second substrate comprising:
a first color filter disposed on the first substrate and to transmit the first light;
a first light control portion, a second light control portion, and a third light control portion disposed on the first color filter and overlapping the light emitting area;
a barrier wall overlapping the non-light-emitting area and disposed on the first color filter; and
a second color filter covering the barrier wall, the second light control portion, and the third light control portion and exposing an upper surface of the first light control portion, wherein:
the first light control portion is configured to transmit the first light,
the second light control portion is configured to convert the first light to a second light,
the third light control portion is configured to convert the first light to a third light, and
the second color filter is configured to absorb the first light.

17. The display panel of claim 16, wherein the barrier wall comprises a first barrier wall, a second barrier wall, and a third barrier wall, which are sequentially stacked, and wherein:
the first barrier wall comprises a same material as the second color filter,
the second barrier wall comprises an inorganic material, and
the third barrier wall comprises an organic material.

18. The display panel of claim 17, wherein at least a portion of the second barrier wall is inserted into each of the first light control portion, the second light control portion, and the third light control portion.

19. The display panel of claim 16, wherein each of the light emitting elements comprises a first electrode, a second electrode, and an organic layer disposed between the first and second electrodes, the organic layer comprising a first light emitting layer to generate the first light.

20. The display panel of claim 19, wherein:
the organic layer further comprises a second light emitting layer to emit the second light or a third light emitting layer to emit the third light, and
the first color filter is provided with an opening defined therethrough.

* * * * *